(12) United States Patent
Chen et al.

(10) Patent No.: US 11,659,759 B2
(45) Date of Patent: May 23, 2023

(54) METHOD OF MAKING HIGH RESOLUTION OLED FABRICATED WITH OVERLAPPED MASKS

(71) Applicant: Applied Materials, Inc., Santa Clara, CA (US)

(72) Inventors: Chung-Chia Chen, New Taipei (TW); Byung-Sung Kwak, Portland, OR (US); Robert Jan Visser, Menlo Park, CA (US)

(73) Assignee: Applied Materials, Inc., Santa Clara, CA (US)

( * ) Notice: Subject to any disclaimer, the term of this patent is extended or adjusted under 35 U.S.C. 154(b) by 102 days.

(21) Appl. No.: 17/142,853

(22) Filed: Jan. 6, 2021

(65) Prior Publication Data

US 2022/0216450 A1    Jul. 7, 2022

(51) Int. Cl.
*H10K 71/00*    (2023.01)
*H10K 59/35*    (2023.01)
*H01L 51/56*    (2006.01)
*H01L 27/32*    (2006.01)

(52) U.S. Cl.
CPC .......... *H01L 51/56* (2013.01); *H01L 27/3211* (2013.01)

(58) Field of Classification Search
CPC ...................................................... H01L 51/56
See application file for complete search history.

(56) References Cited

U.S. PATENT DOCUMENTS

| | | | | |
|---|---|---|---|---|
| 7,675,665 B2 * | 3/2010 | Hagood | ............. | G02B 26/0841 359/290 |
| 7,746,529 B2 * | 6/2010 | Hagood | ................. | G02B 26/02 359/290 |
| 9,176,318 B2 * | 11/2015 | Hagood | ............. | G02B 26/0833 |
| 9,229,222 B2 * | 1/2016 | Hagood | ................. | G02B 26/00 |
| 9,231,002 B2 * | 1/2016 | Oikawa | ............... | H01L 27/1255 |

(Continued)

FOREIGN PATENT DOCUMENTS

| | | |
|---|---|---|
| KR | 100830321 B1 | 5/2008 |
| KR | 101958499 B1 | 3/2019 |

OTHER PUBLICATIONS

PCT Notification of Transmittal of the International Search Report and the Written Opinion of the International Searching Authority for International Application No. PCT/US2021/059154; dated Nov. 12, 2021.

*Primary Examiner* — Caleb E Henry
(74) *Attorney, Agent, or Firm* — Patterson + Sheridan, LLP

(57) ABSTRACT

Embodiments of the present disclosure relate to an apparatus and methods for forming arrays of EL devices and forming the EL devices with overlapped mask plates. The methods utilize overlapping a first mask plate and a second mask plate to form a mask arrangement having first apertures of the first mask plate overlapped with second apertures of the second mask plate forming one or more opening areas. A material is evaporated through the mask arrangement such that layers of the material are formed in a device area of the EL devices. The device area of each of the EL devices corresponds to the opening area of the mask arrangement of the first mask plate and the second mask plate. The method described herein allows for a higher density of the EL devices and creates a smaller deposition area due to the opening area of the mask arrangement.

18 Claims, 21 Drawing Sheets

(56) References Cited

U.S. PATENT DOCUMENTS

| | | | |
|---|---|---|---|
| 9,246,047 B2 * | 1/2016 | Yamazaki | H01L 27/1225 |
| 9,388,488 B2 | 7/2016 | Lee et al. | |
| 10,483,050 B1 * | 11/2019 | Yu | H01G 4/18 |
| 2006/0276096 A1 * | 12/2006 | Wang | H01L 27/3253 |
| | | | 445/2 |
| 2009/0253336 A1 * | 10/2009 | Ito | H01L 27/3216 |
| | | | 445/58 |
| 2011/0031486 A1 | 2/2011 | Shigemura et al. | |
| 2011/0084960 A1 * | 4/2011 | Miyake | G09G 3/3266 |
| | | | 377/64 |
| 2012/0040512 A1 * | 2/2012 | Li | B82Y 30/00 |
| | | | 438/689 |
| 2012/0248973 A1 * | 10/2012 | Ito | C09B 57/00 |
| | | | 252/301.16 |
| 2014/0268272 A1 * | 9/2014 | Brosnihan | G02B 26/023 |
| | | | 359/230 |
| 2014/0268294 A1 * | 9/2014 | Brosnihan | B81B 7/008 |
| | | | 359/290 |
| 2015/0060933 A1 * | 3/2015 | Ohno | H01L 27/3244 |
| | | | 29/721 |
| 2015/0084045 A1 * | 3/2015 | Yamazaki | H01L 27/1222 |
| | | | 257/43 |
| 2016/0056184 A1 * | 2/2016 | Wei | H01L 29/78669 |
| | | | 257/43 |
| 2016/0056342 A1 * | 2/2016 | Wu | H01L 51/0011 |
| | | | 257/89 |
| 2016/0296966 A1 * | 10/2016 | Hong | H01L 51/0011 |
| 2016/0348227 A1 | 12/2016 | Wu et al. | |
| 2019/0345596 A1 * | 11/2019 | Kataoka | C23C 14/042 |
| 2019/0363296 A1 * | 11/2019 | Wang | H01L 51/5256 |
| 2021/0217955 A1 * | 7/2021 | Hu | H01L 51/001 |

\* cited by examiner

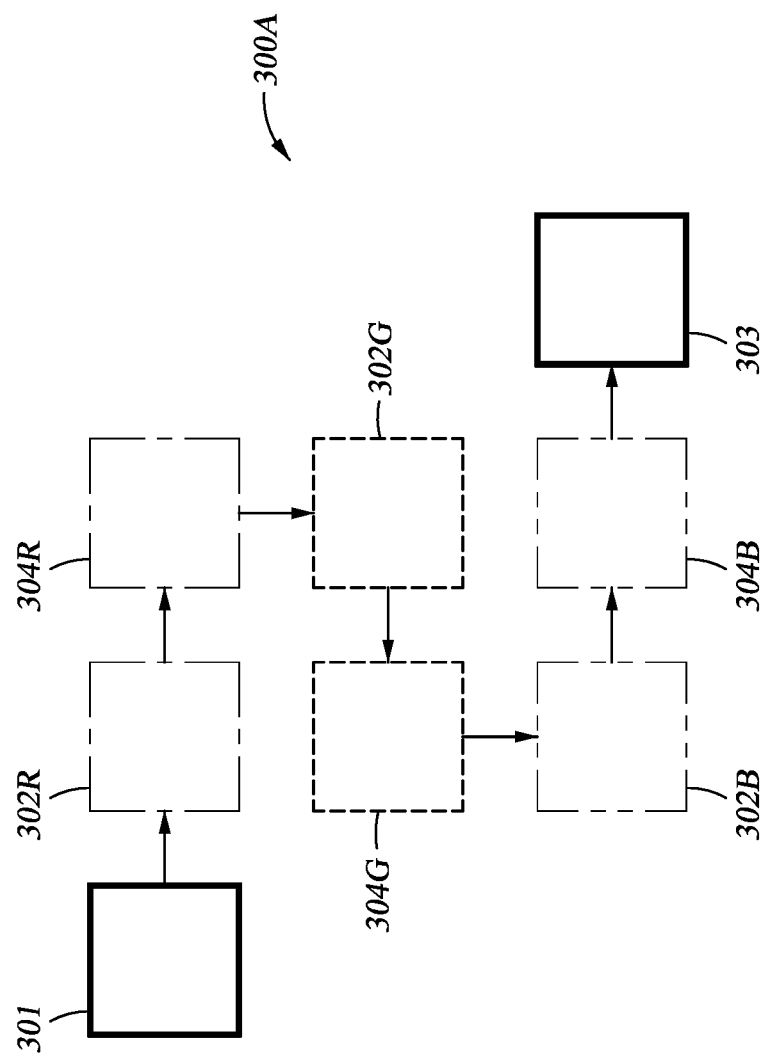
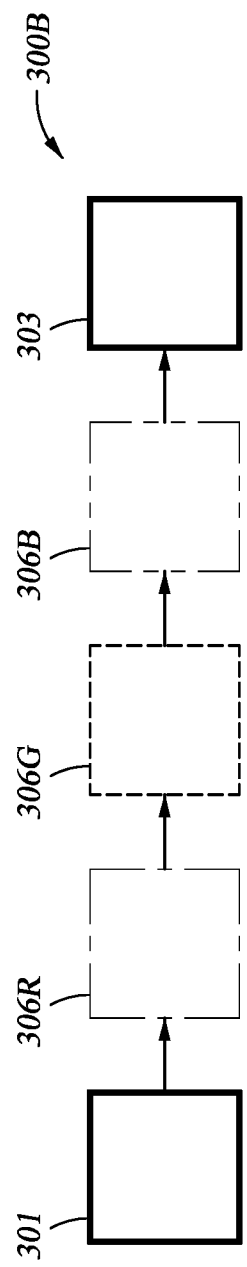
Fig. 3A
Fig. 3B

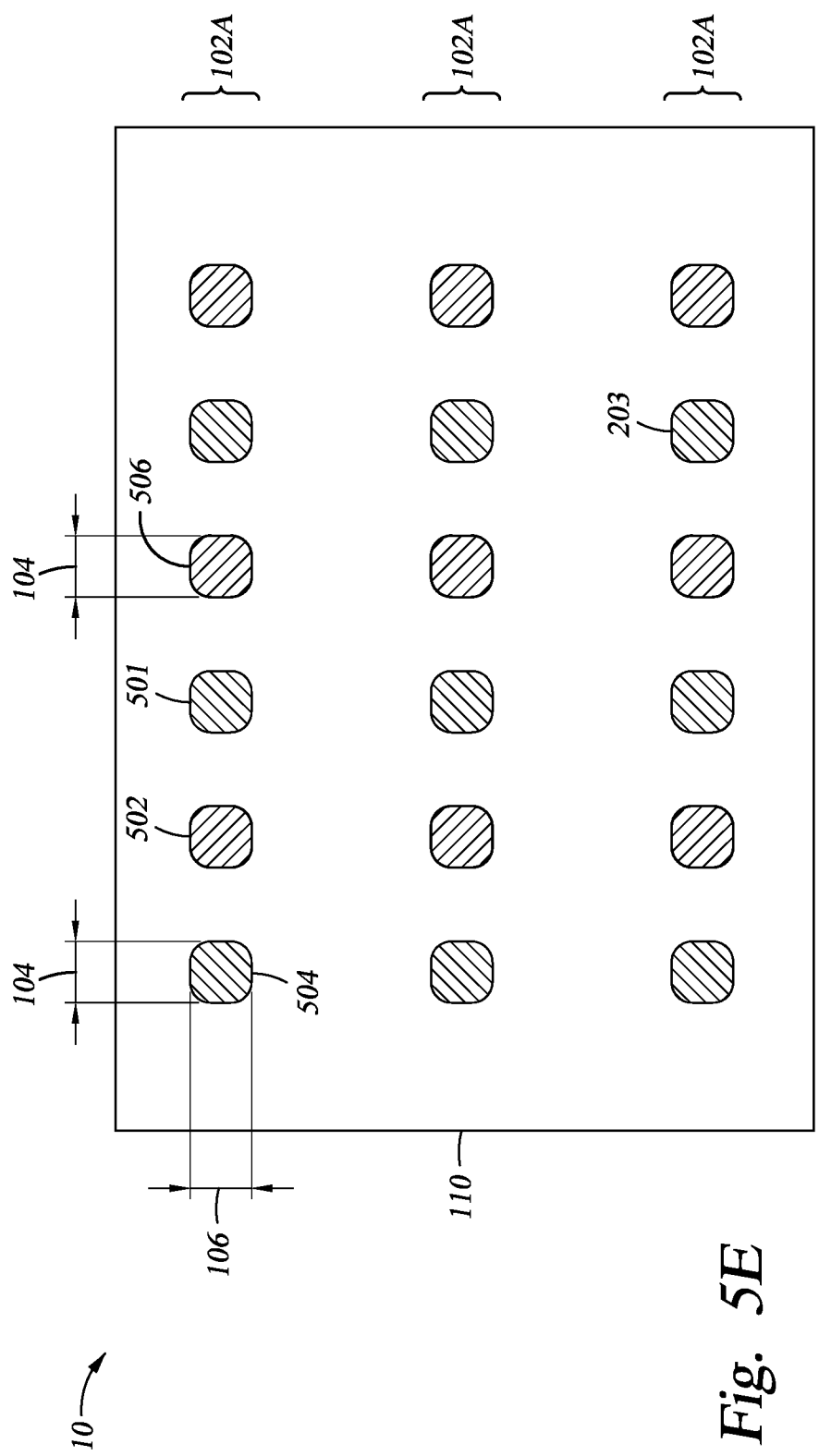

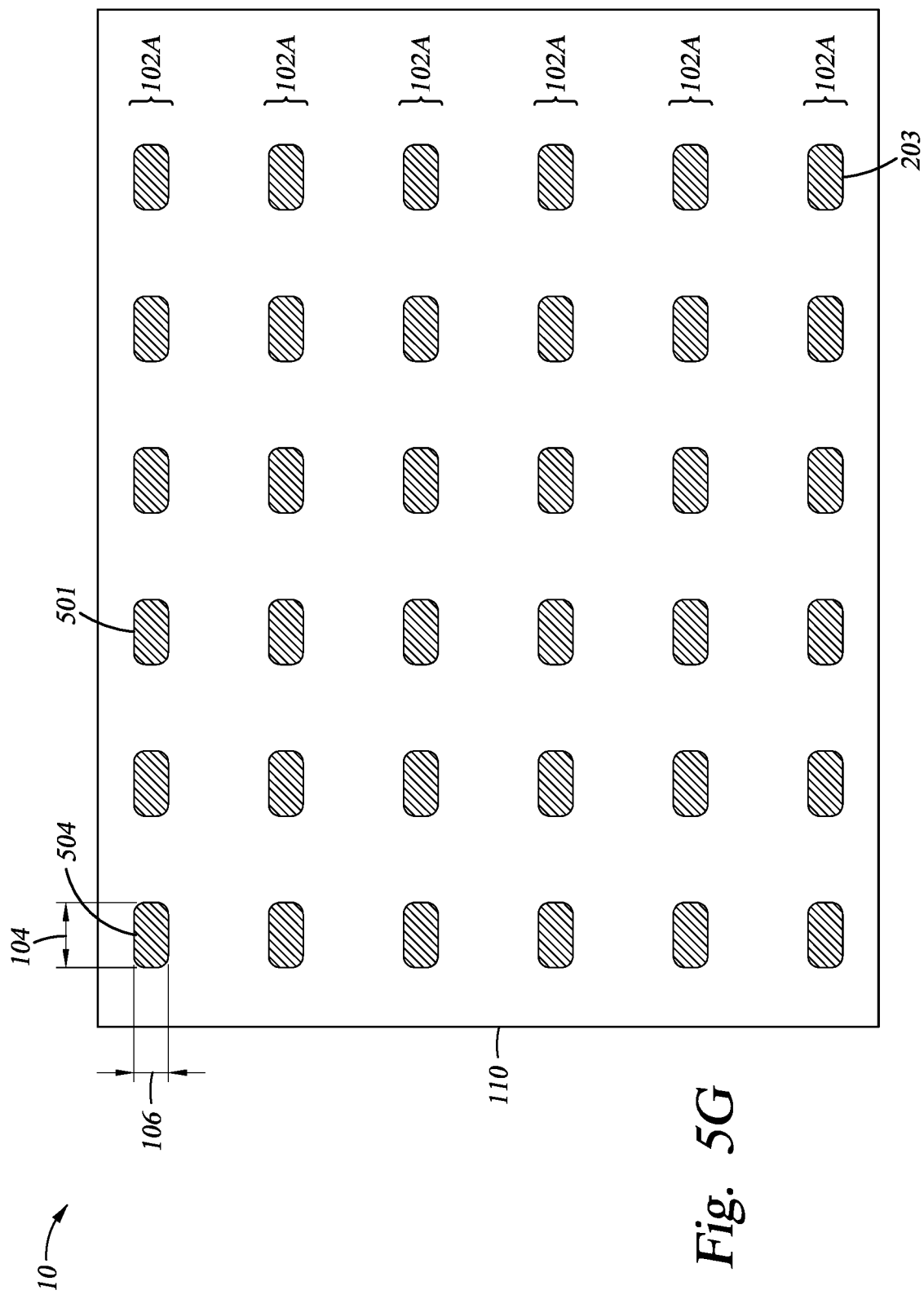

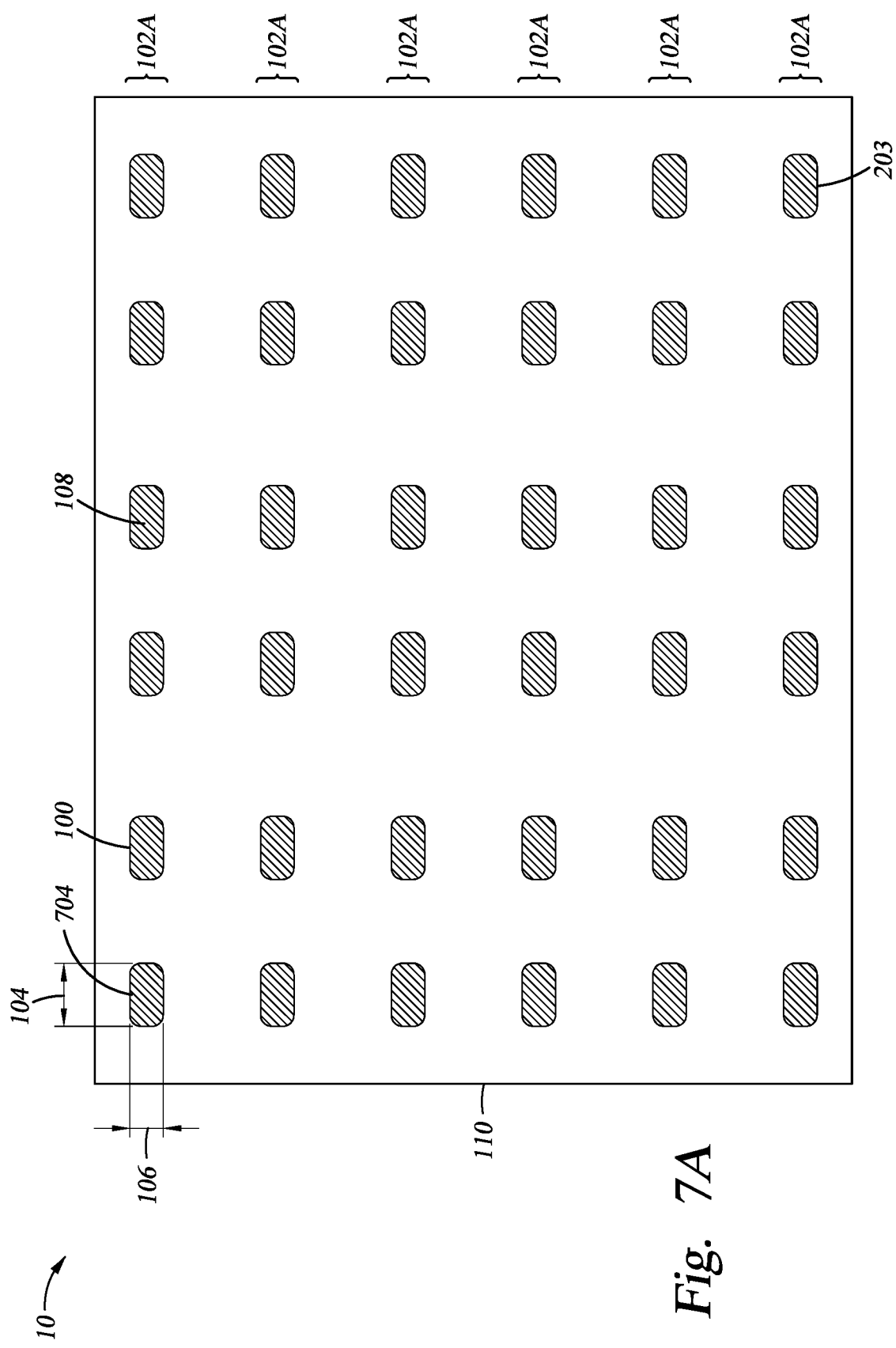

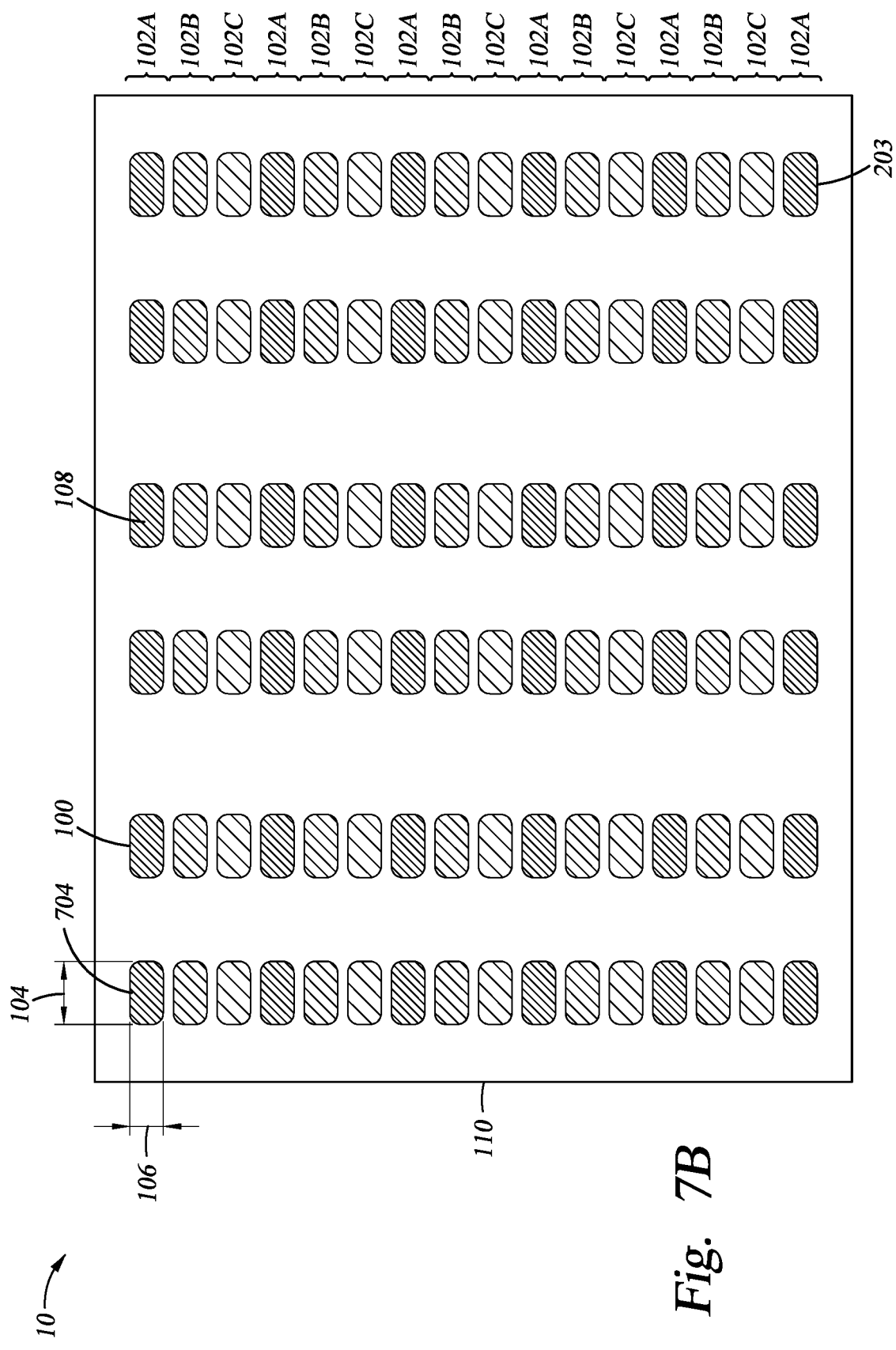

METHOD OF MAKING HIGH RESOLUTION OLED FABRICATED WITH OVERLAPPED MASKS

BACKGROUND

Field

Embodiments of the present disclosure generally relate to electroluminescent (EL) devices. More specifically, embodiments described herein relate to an apparatus and methods for forming arrays of the electroluminescent (EL) devices and forming the EL devices with overlapped mask plates.

Description of the Related Art

Organic light-emitting diode (OLED) technologies used to form the EL devices have become an important next-generation display technology offering many advantages (e.g., high efficiency, wide viewing angles, fast response, and potentially low cost). In addition, as a result of improved efficiency, OLEDs are also becoming practical for some lighting applications. Today's electronics manufacturers are pushing these devices to shrink in size while providing higher resolution than just a few years ago.

Forming arrays of these EL devices is limited by the masks used to pattern separate EL devices. Currently, pattering high density EL devices with a small deposition area is both expensive and the physical limitations of the masks lead to a decrease in EL device performance.

Accordingly, what is needed in the art are improved methods for forming arrays of the EL devices to increase the EL device density and provide improved device performance.

SUMMARY

In one embodiment, a method is provided. The method includes positioning a first mask plate and a second mask plate adjacent to a substrate having an array including one or more first groups of first electroluminescent (EL) devices. The first mask plate and the second mask plate are overlapped to form a mask arrangement having first apertures of the first mask plate overlapped with second apertures of the second mask plate forming one or more opening areas. The method further includes evaporating a material through the one or more opening areas to deposit one or more first layers of the material onto a device area of each of the first EL devices. The device area of each of the first EL devices corresponds to the opening area of the mask arrangement of the first mask plate and the second mask plate.

In another embodiment, a method is provided. The method includes positioning a first mask plate and a second mask plate adjacent to a substrate having an array including one or more first groups of first electroluminescent (EL) devices. The first mask plate and the second mask plate are overlapped to form a mask arrangement having first apertures of the first mask plate overlapped with second apertures of the second mask plate forming one or more opening areas. The method further includes evaporating a material of an organic layer through the one or more opening areas to deposit one or more first layers of the material of the organic layer onto a device area of each of the first EL devices. The device area of each of the first EL devices corresponds to the one or more opening areas of the mask arrangement of the first mask plate and the second mask plate.

In another embodiment, an apparatus is provided. The apparatus includes a frame. The frame is coupled to a first mask plate and second mask plate. The first mask plate includes first apertures and the second mask plate including second apertures. The apparatus further includes a mask arrangement. The mask arrangement includes one or more opening areas formed by overlapping the first apertures of the first mask plate with the second apertures of the second mask plate. The opening areas define a device area of an electroluminescent device to be patterned.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIGS. 3A and 3B are schematic views of a processing system, according to embodiments described herein.

FIGS. 5A-5I are schematic, top views of an array of EL devices, according to embodiments described herein.

FIGS. 7A and 7B are schematic, top views of an array of EL devices, according to embodiments described herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to electroluminescent (EL) devices. More specifically, embodiments described herein relate to an apparatus and methods for forming arrays of the EL devices and forming the EL devices with overlapped mask plates. The EL device formed from the methods described herein will have improved pixel density because of the overlapped masks. In one embodiment, a method is provided. The method includes positioning a first mask plate and a second mask plate adjacent to a substrate having an array including one or more first groups of first electroluminescent (EL) devices. The first mask plate and the second mask plate are overlapped to form a mask arrangement having first apertures of the first mask plate overlapped with second apertures of the second mask plate forming one or more opening areas. The method further includes evaporating a material through the one or more opening areas to deposit one or more first layers of the material onto a device area of each of the first EL devices. The device area of each of the first EL devices corresponds to the opening area of the mask arrangement of the first mask plate and the second mask plate.

Figure 1A:
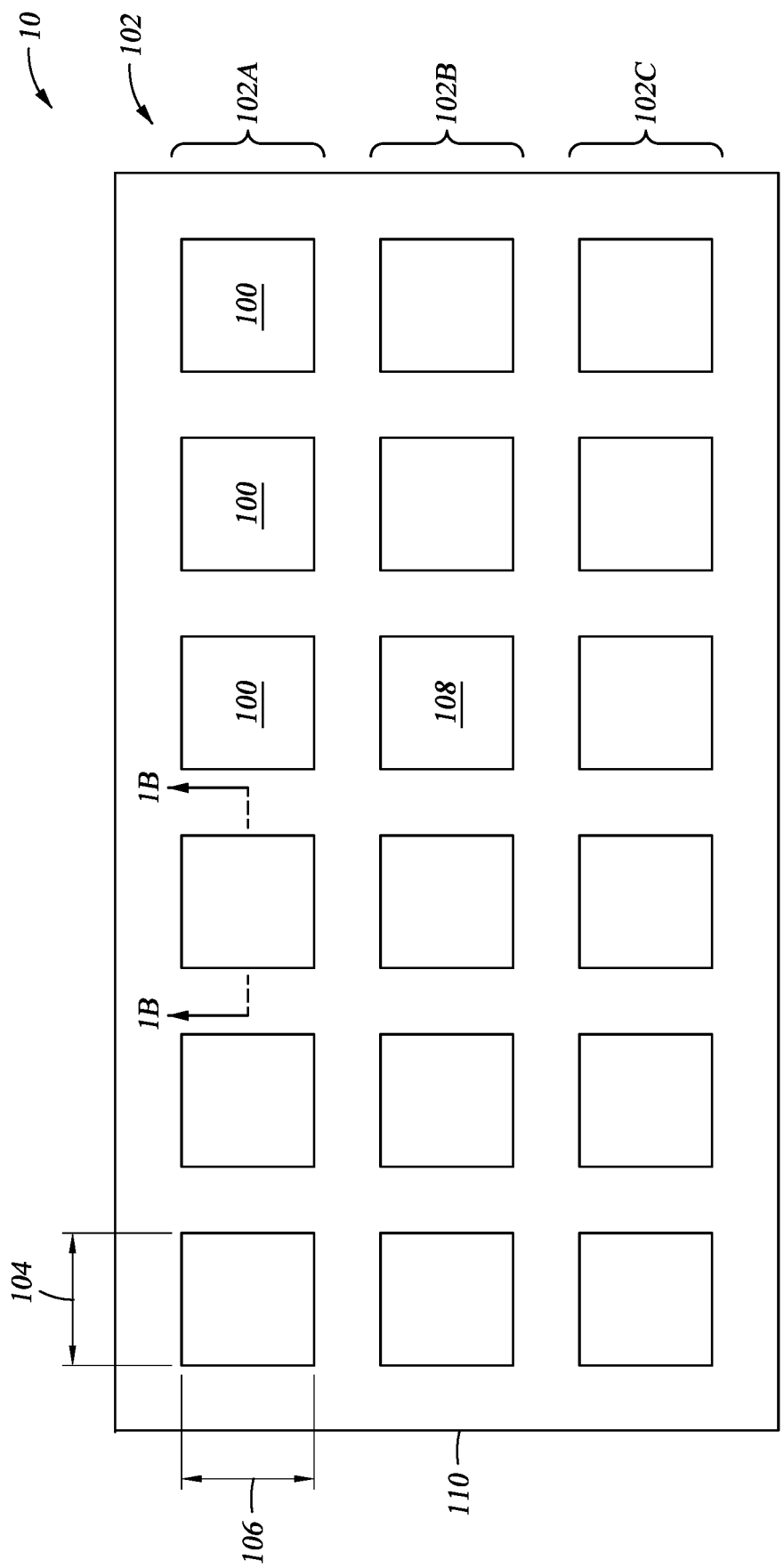
FIG. 1A is a schematic, top view of an array of electroluminescent (EL) devices, according to embodiments described herein.

FIG. 1A is a schematic, top view of an array 10 of electroluminescent (EL) devices 100. The EL devices 100 and the array 10 may be fabricated by the methods 400 and 600 described herein. The array 10 is formed on a substrate 110. In certain embodiments, the EL devices 100 may be OLED display pixels or sub-pixels. Examples of the array 10 may include a top-emitting active matrix OLED display (top-emitting AMOLED) or a bottom-emitting active matrix OLED display (bottom-emitting AMOLED). The array 10 may be applied to other OLED displays. In some examples, a width 104 and a length 106 of the EL devices 100 may be 20 µm or less. For example, the width 104 and the length 106 are less than 10 µm. In another example, the width 104 and the length 106 are between 1 µm and 5 µm. A device area 108 of the EL devices 100 may be 400 µm$^2$ or less. Although the EL devices 100 in FIG. 1A are depicted to have a square shape, the EL devices 100 can have any shape such as a circular, triangular, or rectangular shape. The array 10 has a pixel per inch (PPI) related to the number of pixels or sub-pixels (i.e., EL devices 100) in a 1 inch line of the array 10.

In embodiments described herein, groups 102 include EL devices 100 configured to emit a white, red, green, blue or other color light when energized. The groups 102 may correspond to rows, columns, pantiles, or other arrangements of the EL devices 100. For example, a group 102A includes first EL devices 100A configured to emit a first light (e.g., red light), a group 102B includes second EL devices 100B configured to emit a second light (e.g., green light), and a group 102C includes third EL devices 100C configured to emit a third light (e.g., blue light). The array 10 of FIGS. 5A-5I fabricated by the method 400 described herein and the array 10 of FIGS. 7A and 7B fabricated by the methods 600 described herein include multiple groups 102A, 102B, and 102C. While only three groups 102A, 102B, and 102C are depicted for the array 10 of FIGS. 1A, FIGS. 5A-5I, and FIGS. 7A and 7B, the array 10 can include more than three groups of EL devices 100. In one embodiment, which can be combined with other embodiments described herein, a fourth group including fourth EL devices is configured to emit a fourth light (e.g., white light). The EL devices 100 are not limited to emit a particular light in each group. Each group 102 of EL devices 100 is operable to emit any colored light.

Figure 1B:
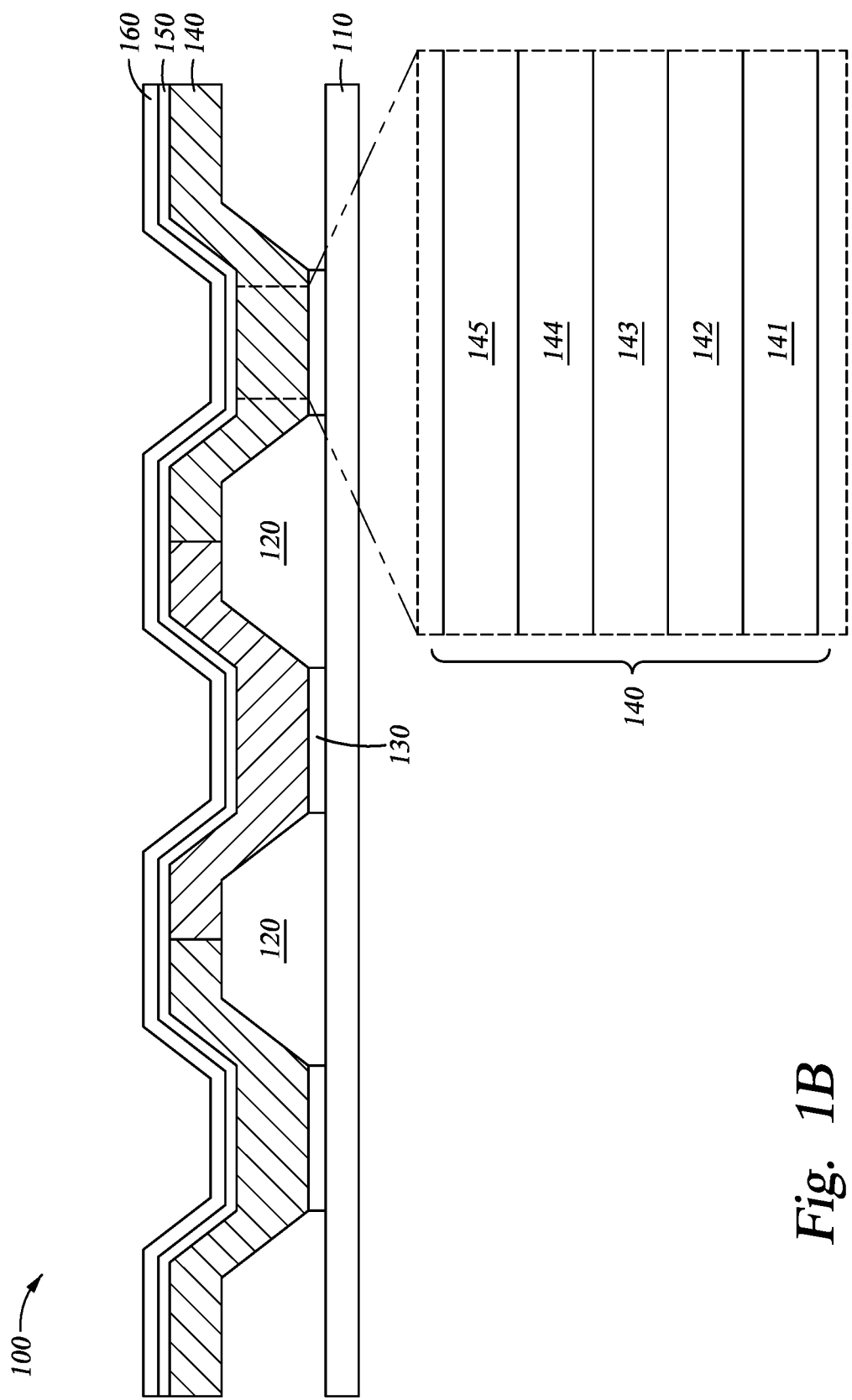
FIG. 1B is a schematic, cross sectional view of an EL device, according to embodiments described herein.

FIG. 1B is a schematic, cross sectional view of an EL device 100. The EL device 100 includes at least the substrate 110, a pixel definition layer (PDL) 120, a bottom electrode layer 130, an organic layer 140, a top electrode layer 150, and a capping layer 160. An encapsulation layer 170 (not shown) may be disposed over the capping layer and the top electrode layer 150. The organic layer 140 is configured to emit a white, red, green, blue or other color light when energized. In one embodiment, which can be combined with other embodiments described herein, the organic layer 140 includes a plurality of organic sublayers. The plurality of organic sublayers include one or more of a hole injection layer (HIL) 141, a hole transport layer (HTL) 142, an emissive layer (EML) 143, an electron transport layer (ETL) 144, or an electron injection layer (EIL) 145. The organic layer 140 is not particularly limited to the illustrated embodiment. For example, in another embodiment, which can be combined with other embodiments described herein, one or more organic sublayers may be omitted from the organic layer 140. In yet another embodiment, one or more additional organic sublayers may be added to the organic layer 140. In yet another embodiment, which can be combined with other embodiments described herein, the organic layer 140 may be inverted such that the plurality of organic sublayers are reversed.

In one embodiment, which can be combined with other embodiments described herein, layers of the plurality of organic sublayers are patterned while other layers of the plurality of organic sublayers are deposited as blanket layers. For example, the EML 143 is patterned on the EL device 100 using a fine metal mask (FMM). The EML 143 will be deposited between adjacent PDLs 120. The EIL 145, ETL 144, HIL 141, and HTL 142 are blanket layers deposited using an open mask and will therefore be conformal to the previously deposited layers.

In one embodiment, which can be combined with other embodiments described herein, the bottom electrode layer 130 is disposed over the substrate 110. The substrate 110 may be formed from one or more of a silicon, glass, quartz, plastic, or metal foil material. In another embodiment, which can be combined with other embodiments described herein, the bottom electrode layer 130 is patterned between adjacent PDLs 120 such that the bottom electrode layer 130 contacts sidewalls of the adjacent PDLs 120 (shown in FIG. 1B). In yet another embodiment, which can be combined with other embodiments described herein, the bottom electrode layer 130 is an anode. In one embodiment, which can be combined with other embodiments described herein, the bottom electrode layer 130 may be a monolayer. In another embodiment, which can be combined with other embodiments described herein, the bottom electrode layer 130 may be a multi-layer stack. In yet another embodiment, which can be combined with other embodiments described herein, the bottom electrode layer 130 may be reflective.

The organic layer 140 is disposed over the bottom electrode layer 130 and the PDL 120. In one embodiment, which can be combined with other embodiments described herein, the organic layer 140 may be conformal to the bottom electrode layer 130 and the PDL 120. The top electrode layer 150 is disposed over the organic layer 140 and the PDL 120. In one embodiment, which can be combined with other embodiments described herein, the top electrode layer 150 is a cathode. In another embodiment, which can be combined with other embodiments described herein, the top electrode layer 150 may be conformal to the organic layer 140.

The capping layer 160 is disposed over the top electrode layer 150. The capping layer 160 modifies light extraction characteristics while providing protection of the EL device 100. The capping layer 160 may include, but is not limited to, any suitable material that can be integrated into OLED fabrication, such as organic materials (e.g., N,N'-Bis (napthalen-1-yl)-N,N'-bis(phenyl)benzidine, or NPB), inorganic materials, resins, or a combination thereof. In one embodiment, an encapsulation layer (not shown) is disposed over the capping layer 160 and the top electrode 150 layer. The encapsulation layer is formed by alternating layers of organic and dielectric materials. The dielectric material includes, but is not limited to, an inorganic material such as silicon nitride (SiNx), silicon oxide (SiOx), or silicon oxynitride (SiON).

Figure 2A:
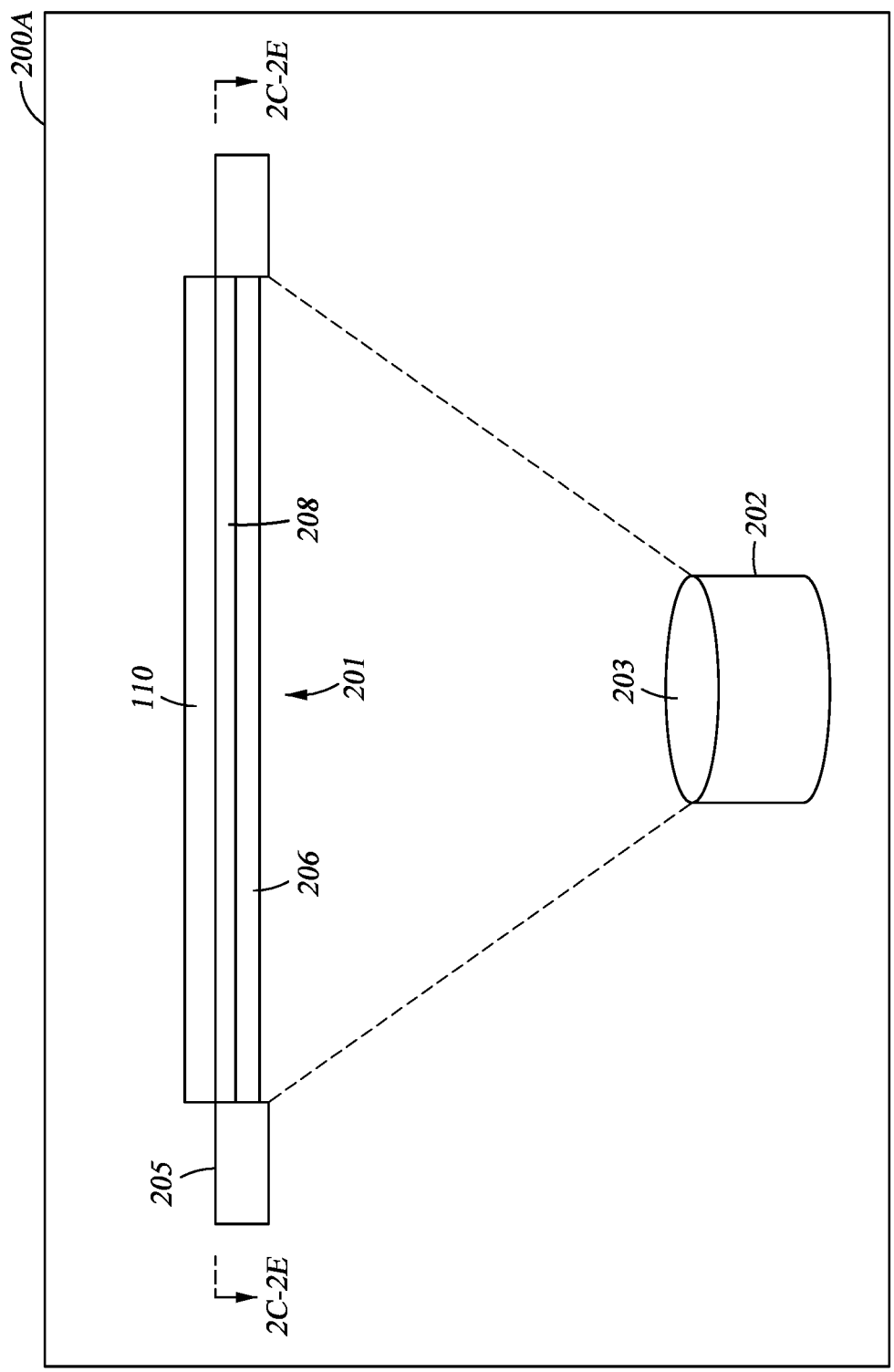
FIGS. 2A and 2B are schematic, cross sectional views of a thermal evaporation chamber, according to embodiments described herein.
Figure 2B:
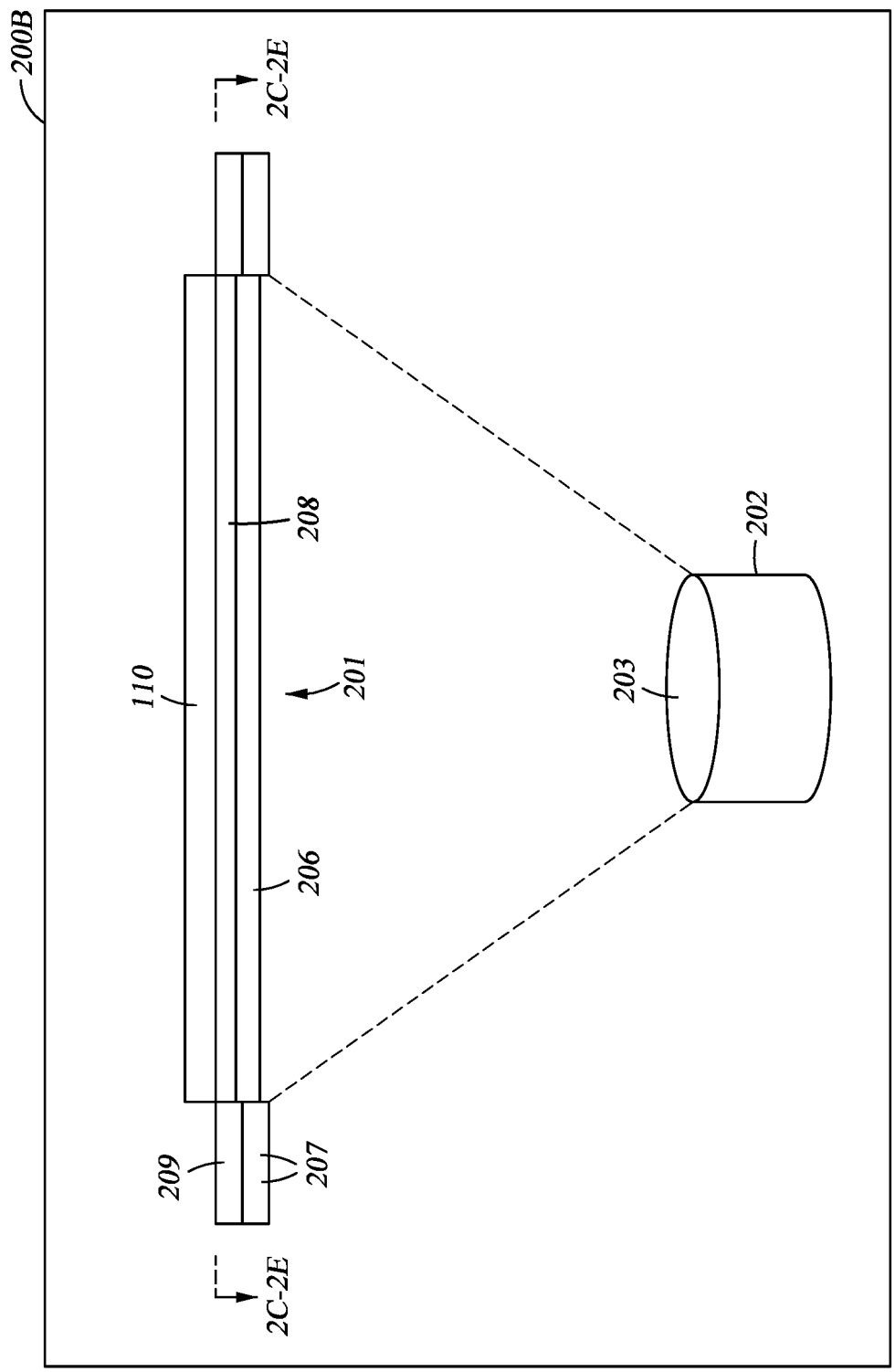

FIG. 2A and FIG. 2B are schematic, cross sectional views of a thermal evaporation chamber 200A, 200B. The thermal evaporation chamber 200A, 200B includes an evaporation source 202. Although a point source is shown in FIGS. 2A and 2B, different types of evaporation sources such as linear sources or area sources can be adopted. The evaporation source 202 is operable to evaporate a material 203 in the thermal evaporation chamber 200A, 200B. The thermal evaporation chamber 200A includes a frame 205 disposed between the substrate 110 and the evaporation source 202. The frame 205 includes a first mask plate 206 disposed under a second mask plate 208. The first mask plate 206 and the second mask plate 208 are coupled (e.g., welded) to the frame 205. The thermal evaporation chamber 200B includes a first frame 207 and a second frame 209 disposed between the substrate 110 and the evaporation source 202. The first frame 207 is disposed under the second frame 209. The first mask plate 206 and the second mask plate 208 are disposed over each other in one or more mask arrangements 201.

One or more of the organic layer 140 (including one or more of a HIL 141, a HTL 142, an EML 143, an ETL 144, or an EIL 145), the top electrode layer 150, or the capping layer 160 may be deposited by a thermal evaporation process. The thermal evaporation process utilizes the evaporation source 202 having the material 203 disposed therein for evaporation (as shown in FIGS. 2A and 2B). In one embodiment, which can be combined with other embodiments described herein, the material 203 is a sublimation material or a melting material. The evaporation source 202 is heated and the material 203 reaches a gasification temperature. After reaching the gasification temperature of the material 203, the material 203 becomes gas and passes through a common mask to form a blanket deposition of the material or through the aperture of a mask plate (such as the mask arrangement 201) to form the groups 102 of EL devices 100. The gas molecules are disposed on the substrate 110, and become solid state molecules as temperature descends. The solid state molecules of material accumulate and slowly form a layer on the substrate 110. The material 203 includes one of a material for the organic layer 140, the top electrode layer 150, or the capping layer 160. In embodiments where the material 203 is to be a blanket deposition, the common mask may be used. For example, the top electrode layer 150 is deposited through the common mask.

In embodiments where the material 203 is to be patterned, the mask arrangement 201 described above is used. The function of the first mask plate 206 and the second mask plate 208 is to evaporate the material on a device area 108 corresponding to each of the EL devices 100 of the array. The mask arrangement 201 includes opening areas 216 (shown in FIGS. 2C-2E) that limit the device area 108 to each of the EL devices 100. Therefore, the mask arrangement 201 is utilized to form the EL device 100 with a width 104 and length 106 less than 20 µm. The mask arrangement 201 is formed by overlapping the first mask plate 206 and the second mask plate 208. The mask arrangement 201 includes the opening area 216 having a width 218 and a length 220 less than 20 um. In one embodiment, which can be combined with other embodiments described herein, the methods 400 and 600 described herein deposit one or more layers of the material 203 with the EL devices 100 having a PPI higher than 400.

Figure 2C:
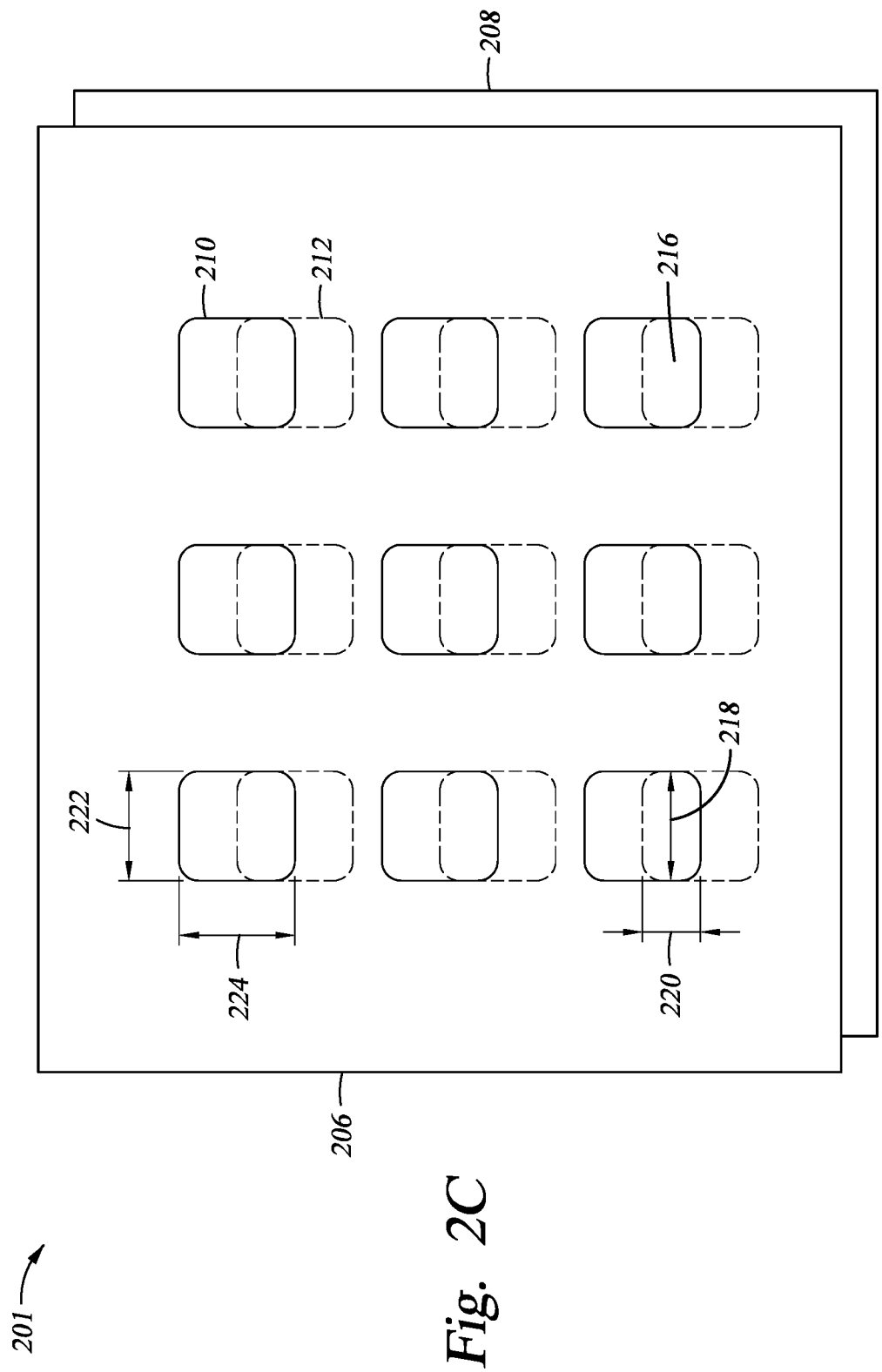
FIGS. 2C-2E are schematic, top views of a mask arrangement, according to embodiments described herein.
Figure 2D:
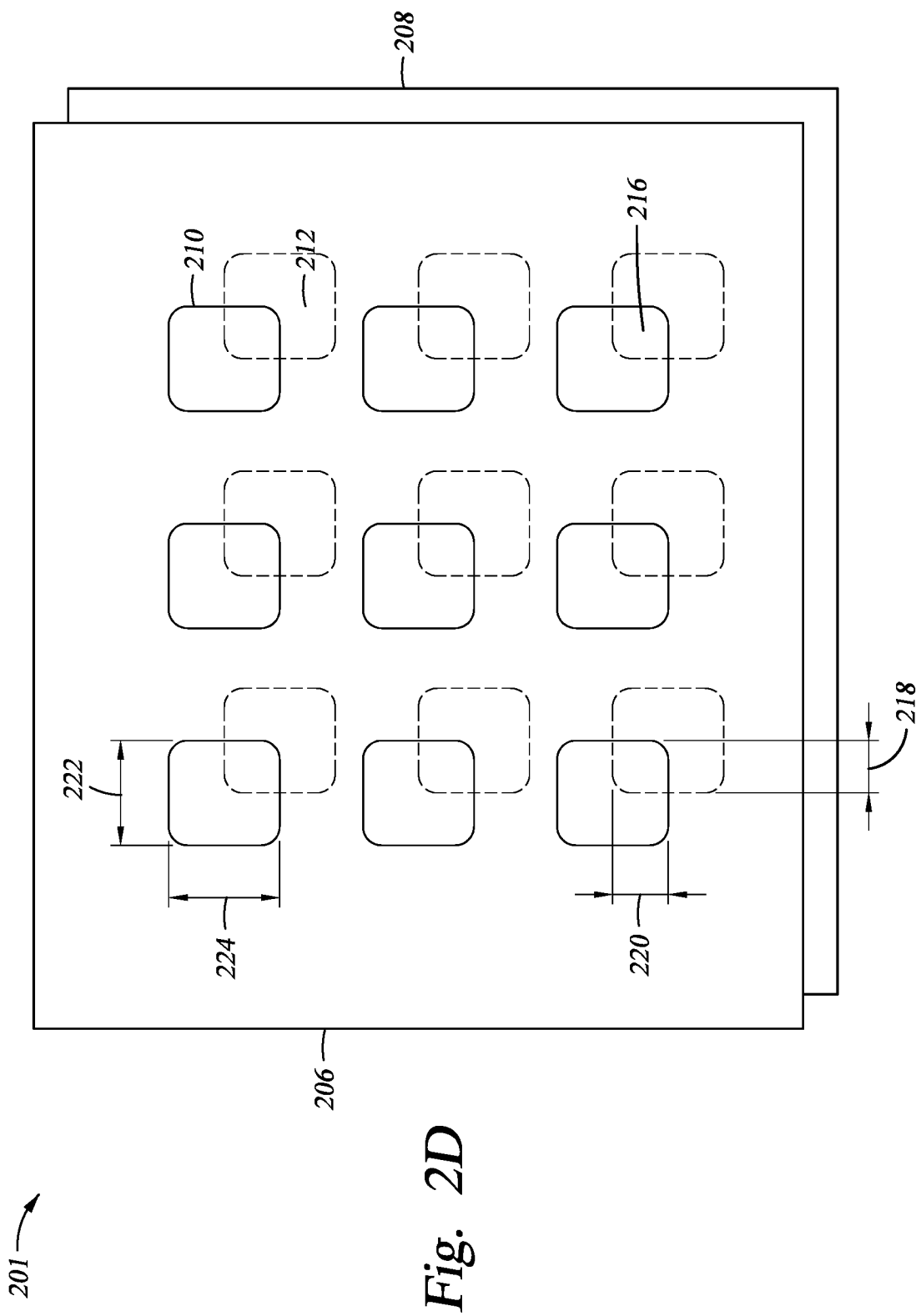
Figure 2E:
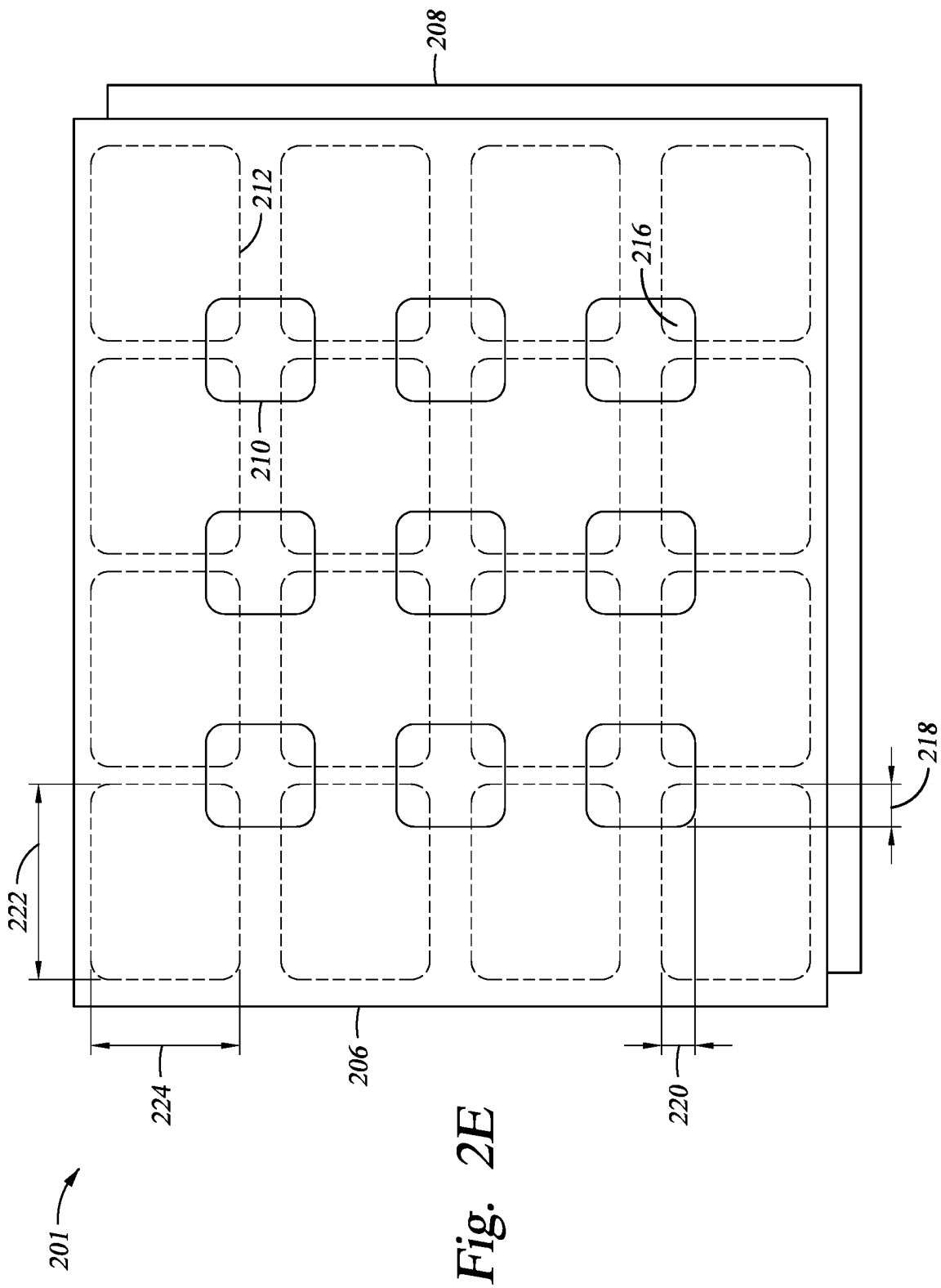

FIGS. 2C-2E are schematic, top views of a mask arrangement 201. The mask arrangement 201 includes the first mask plate 206 overlapped with the second mask plate 208. The first mask plate 206 includes first apertures 210 overlapped with second apertures 212 of the second mask plate 208 to form an opening area 216. The opening area 216 includes the width 218 and the length 220. The first apertures 210 and second apertures 212 each have an aperture width 222 and an aperture length 224. The width 218 and the length 220 are each less than 20 um. The width 218 and the length 220 are less than the aperture width 222 and the aperture length 224. As shown in FIGS. 2C-2E, the aperture width 222 and the aperture length 224 of the first apertures 210 are equal to the aperture width 222 and the aperture length 224 of the second apertures 212. In one embodiment, which can be combined with other embodiments described herein, the aperture width 222 of the first apertures 210 is different from the aperture width 222 of the second apertures 212. In another embodiment, which can be combined with other embodiments described herein, the aperture length 224 of the first apertures 210 is different from the aperture length 224 of the second apertures 212. In yet another embodiment, which can be combined with other embodiments described herein, the aperture width 222 and the aperture length 224 of adjacent first apertures 210 of the first apertures 210 are not equal. In yet another embodiment, which can be combined with other embodiments described herein, the aperture width 222 and the aperture length 224 of adjacent second apertures 212 of the second apertures 212 are not equal.

The opening area 216 corresponds to the device area 108 of each of the EL devices 100. The material 203 heated by the evaporation source reaches a gasification temperature, becomes gas, and sublimates to pass through the opening area 216 of the mask arrangement 201 of the first mask plate 206 and the second mask plate 208. The material 203 forms a layer of the EL device 100 of one or more groups 102A, 1026, and 102C of the array 10 according to the methods 400 and 600 described herein. The layer of the material 203 corresponds to one of the organic layer 140, or the capping layer 160. Although the opening areas 216 in FIGS. 2C-2E are depicted to have a square or rectangular shape, the opening areas 216 can have any shape such as a circular, triangular, or polygonal shape.

The first apertures 210 of the first mask plate 206 and the second apertures 212 of the second mask plate 208 can be overlapped to create different mask arrangements 201. In one embodiment, which can be combined with other embodiments described herein, as shown in FIG. 2C-2E, a ratio of the number of first apertures 210 that are overlapped with the second apertures 212 is 1:N, with N being any integer. For example, as shown in FIGS. 2C and 2D, the ratio of first apertures 210 overlapped with second apertures 212 is 1:1. As shown in FIG. 2E, the ratio of first apertures 210 overlapped with second apertures 212 is 1:4. In another embodiment, which can be combined with other embodiments described herein, a ratio of the number of first apertures 210 that are overlapped with the second apertures 212 is N:1, with N being any integer. In embodiments where N is greater than 1, the material 203 evaporated through the mask arrangement 201 may result in a PPI that enables the method 600 to be utilized. The method 600 provides for a single deposition step in a thermal evaporation chamber 306R, 306G, 306B (shown in FIG. 3B) since multiple deposition steps are not required to achieve a desired PPI for a single deposition step, such as a PPI higher than 400.

FIG. 3A is a schematic view of a processing system 300A, as described herein. The process system 300A is a multi-chamber system that can form the array 10 of EL devices 100. The processing system 300A is utilized in the method 400, as described herein. The process system 300A includes one or more chambers 301. The one or more chambers 301 are configured to deposit one or more initial layers. The one or more initial layers may include the organic layer 140 (including one or more of a HIL 141 or a HTL 142). The one or more chambers 301 are operable to sequentially deposit the one or more initial layers. The one or more chambers 301 include, but are not limited to, chambers configured for thermal evaporation under vacuum conditions, ink jet printing, vapor jet printing, or any other suitable technique, or combinations thereof. In one embodiment, which can be combined with other embodiments described herein, the one or more initial layers are deposited using thermal evaporation under vacuum conditions.

The processing system 300A includes thermal evaporation chambers 302R and 304R. The thermal evaporation chambers 302R, 304R are one of the thermal evaporation chambers 200A or the thermal evaporation chamber 200B of FIGS. 2A and 2B. The thermal evaporation chambers 302R, 304R are operable to deposit a material 203 corresponding to one or more of the organic layer 140 (including one or more of a HIL 141, a HTL 142, an EML 143, an ETL 144, or an EIL 145), or the capping layer 160. The thermal evaporation chambers 302R, 304R deposit the material 203 onto the EL device 100. The masks arrangement 201 in one of the thermal evaporation chambers 302R, 304R includes the opening area 216 with a length 220 and width 218 smaller than the lengths and widths of the first apertures 210 and second apertures 212. The mask arrangement 201 can be used to deposit the material 203 onto the EL device 100. In one embodiment, which can be combined with other embodiments described herein, the organic layer 140 is deposited in the thermal evaporation chambers 302R, 304R onto the EL device 100. The organic layer 140 emits a first light (e.g., red light).

The processing system 300A includes a thermal evaporation chamber 302G and 304G. The thermal evaporation chambers 302G, 304G are one of thermal evaporation chambers 200A or the thermal evaporation chamber 200B of FIGS. 2A and 2B. The thermal evaporation chambers 302G, 304G are operable to deposit a material 203 corresponding to one or more of the organic layer 140 (including one or more of a HIL 141, a HTL 142, an EML 143, an ETL 144, or an EIL 145), or the capping layer 160. The thermal evaporation chambers 302G, 304G deposit the material 203 onto the EL device 100. The masks arrangement 201 in one of the thermal evaporation chambers 302G, 304G includes the opening area 216 with a length 220 and width 218 smaller than the lengths and widths of the first apertures 210 and second apertures 212. The mask arrangement 201 can be used to deposit the material 203 onto the EL device 100. In one embodiment, which can be combined with other embodiments described herein, the organic layer 140 is deposited in the thermal evaporation chamber 302G, 304G onto the EL device 100. The organic layer 140 emits a second light (e.g., green light).

The processing system 300A includes thermal evaporation chambers 302B, 304B. The thermal evaporation chamber 302B, 304B are one of the thermal evaporation chambers 200A or the thermal evaporation chamber 200B of FIGS. 2A and 2B. The thermal evaporation chambers 302B, 304B are operable to deposit a material 203 corresponding to one or more of the organic layer 140 (including one or more of a HIL 141, a HTL 142, an EML 143, an ETL 144, or an EIL 145), or the capping layer 160. The thermal evaporation chambers 302B, 304B deposit the material 203 onto the EL device 100. The masks arrangement 201 in one of the thermal evaporation chambers 302B, 304B includes the opening area 216 with a length 220 and width 218 smaller than the lengths and widths of the first apertures 210 and second apertures 212. The mask arrangement 201 can be used to deposit the material 203 onto the EL device 100. In one embodiment, which can be combined with other embodiments described herein, the organic layer 140 is deposited in the thermal evaporation chambers 302B, 304B onto the EL device 100. The organic layer 140 emits a third light (e.g., blue light).

The processing system 300A includes one or more chambers 303. The one or more chambers 303 are configured to deposit one or more sequential layers. The one or more sequential layers may include the organic layer 140 (including one or more of an ETL 144 or an EIL 145), the top electrode layer 150, or the capping layer 160. The one or more chambers 303 are operable to sequentially deposit the one or more sequential layers. The one or more chambers 303 include, but are not limited to, chambers configured for thermal evaporation under vacuum, ink jet printing, vapor jet printing, sputtering, or any other suitable technique, or combinations thereof. In one embodiment, which can be combined with other embodiments described herein, the one or more sequential layers are deposited using thermal evaporation under vacuum conditions.

FIG. 3B is a schematic view of a processing system 300B as described herein. The process system 300B is a multi-chamber system that can form the array 10 of EL devices 100. The processing system 300B is utilized in the method 600, as described herein. The process system 300B includes one or more chambers 301. The one or more chambers 301 are configured to deposit one or more initial layers. The one or more initial layers may include the organic layer 140 (including one or more of a HIL 141 or a HTL 142). The one or more chambers 301 are operable to sequentially deposit the one or more initial layers. The one or more chambers 301 include, but are not limited to, chambers configured for thermal evaporation under vacuum, ink jet printing, vapor jet printing, or any other suitable technique, or combinations thereof. In one embodiment, which can be combined with other embodiments described herein, the one or more initial layers are deposited using thermal evaporation under vacuum conditions.

The processing system 300B includes a thermal evaporation chamber 306R. The thermal evaporation chamber 306R is one of the thermal evaporation chambers 200A or the thermal evaporation chamber 200B of FIGS. 2A and 2B. The thermal evaporation chamber 306R is operable to deposit a material 203 corresponding to one or more of the organic layer 140 (including one or more of a HIL 141, a HTL 142, an EML 143, an ETL 144, or an EIL 145), or the capping layer 160. The thermal evaporation chamber 306R deposits the material 203 onto the EL device 100. The masks arrangement 201 in the thermal evaporation chamber 306R includes the opening area 216 with a length 220 and width 218 smaller than the lengths and widths of the first apertures 210 and second apertures 212. The mask arrangement 201 can be used to deposit the material 203 onto the EL device 100. In one embodiment, which can be combined with other embodiments described herein, the organic layer 140 is deposited in the thermal evaporation chambers 306R onto the EL device 100. The organic layer 140 emits a first light (e.g., red light).

The processing system 300B includes thermal evaporation chamber 306G. The thermal evaporation chamber 306G is one of the thermal evaporation chambers 200A or the thermal evaporation chamber 200B of FIGS. 2A and 2B. The thermal evaporation chamber 306G is operable to deposit a material 203 corresponding to one or more of the organic layer 140 (including one or more of a HIL 141, a HTL 142, an EML 143, an ETL 144, or an EIL 145), or the capping layer 160. The thermal evaporation chamber 306G deposits the material 203 onto the EL device 100. The masks arrangement 201 in the thermal evaporation chamber 306G includes the opening area 216 with a length 220 and width 218 smaller than the lengths and widths of the first apertures 210 and second apertures 212. The mask arrangement 201 can be used to deposit the material 203 onto the EL device 100. In one embodiment, which can be combined with other embodiments described herein, the organic layer 140 is deposited in the thermal evaporation chamber 306G onto the EL device 100. The organic layer 140 emits a second light (e.g., green light).

The processing system 300B includes thermal evaporation chamber 306B. The thermal evaporation chamber 306B is one of the thermal evaporation chambers 200A or the thermal evaporation chamber 200B of FIGS. 2A and 2B. The thermal evaporation chamber 306B is operable to deposit a material 203 corresponding to one or more of the organic layer 140 (including one or more of a HIL 141, a HTL 142, an EML 143, an ETL 144, or an EIL 145), or the capping layer 160. The thermal evaporation chamber 306B deposits the material 203 onto the EL device 100. The masks arrangement 201 in the thermal evaporation chamber 306B includes the opening area 216 with a length 220 and width 218 smaller than the lengths and widths of the first apertures 210 and second apertures 212. The mask arrangement 201 can be used to deposit the material 203 onto the EL device 100. In one embodiment, which can be combined with other embodiments described herein, the organic layer 140 is deposited in the thermal evaporation chambers 306B onto the EL device 100. The organic layer 140 emits a third light (e.g., blue light).

The processing system 300B includes one or more chambers 303. The one or more chambers 303 are configured to deposit one or more sequential layers. The one or more sequential layers may include the organic layer 140 (including one or more of an ETL 144 or an EIL 145), the top electrode layer 150, or the capping layer 160. The one or more chambers 303 are operable to sequentially deposit the one or more sequential layers. The one or more chambers 303 include, but are not limited to, chambers configured for thermal evaporation under vacuum, ink jet printing, vapor jet printing, sputtering, or any other suitable technique, or combinations thereof. In one embodiment, which can be combined with other embodiments described herein, the one or more sequential layers are deposited using thermal evaporation under vacuum conditions.

Figure 4:
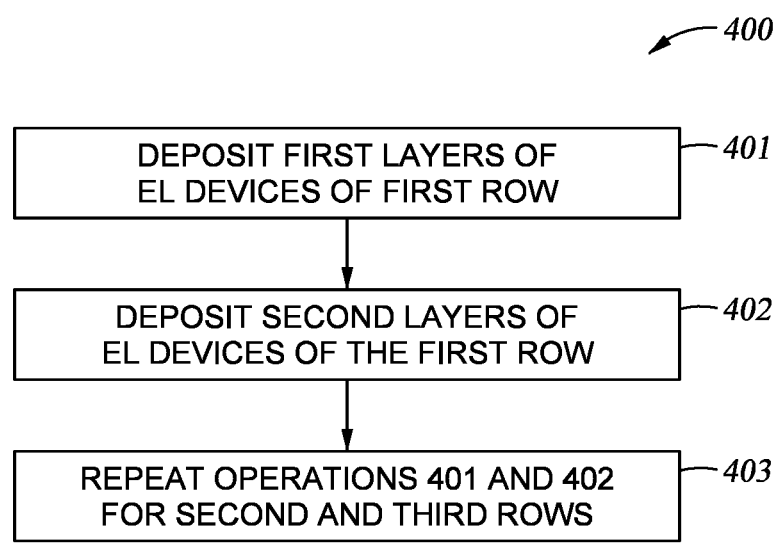
FIG. 4 is a flow diagram of a method for forming the array of EL devices, according to embodiments described herein.

FIG. 4 is a flow diagram of a method 400 for forming the array 10 of EL devices 100. FIGS. 5A-5I are schematic, top views of an array 10 of electroluminescent (EL) devices 100, according to embodiments described herein. To facilitate explanation, the method 400 will be described with reference to the processing system 300A of FIG. 3A. However, it is to be noted that processing systems other than the processing system 300A may be utilized in conjunction with method 400.

Figure 5A:
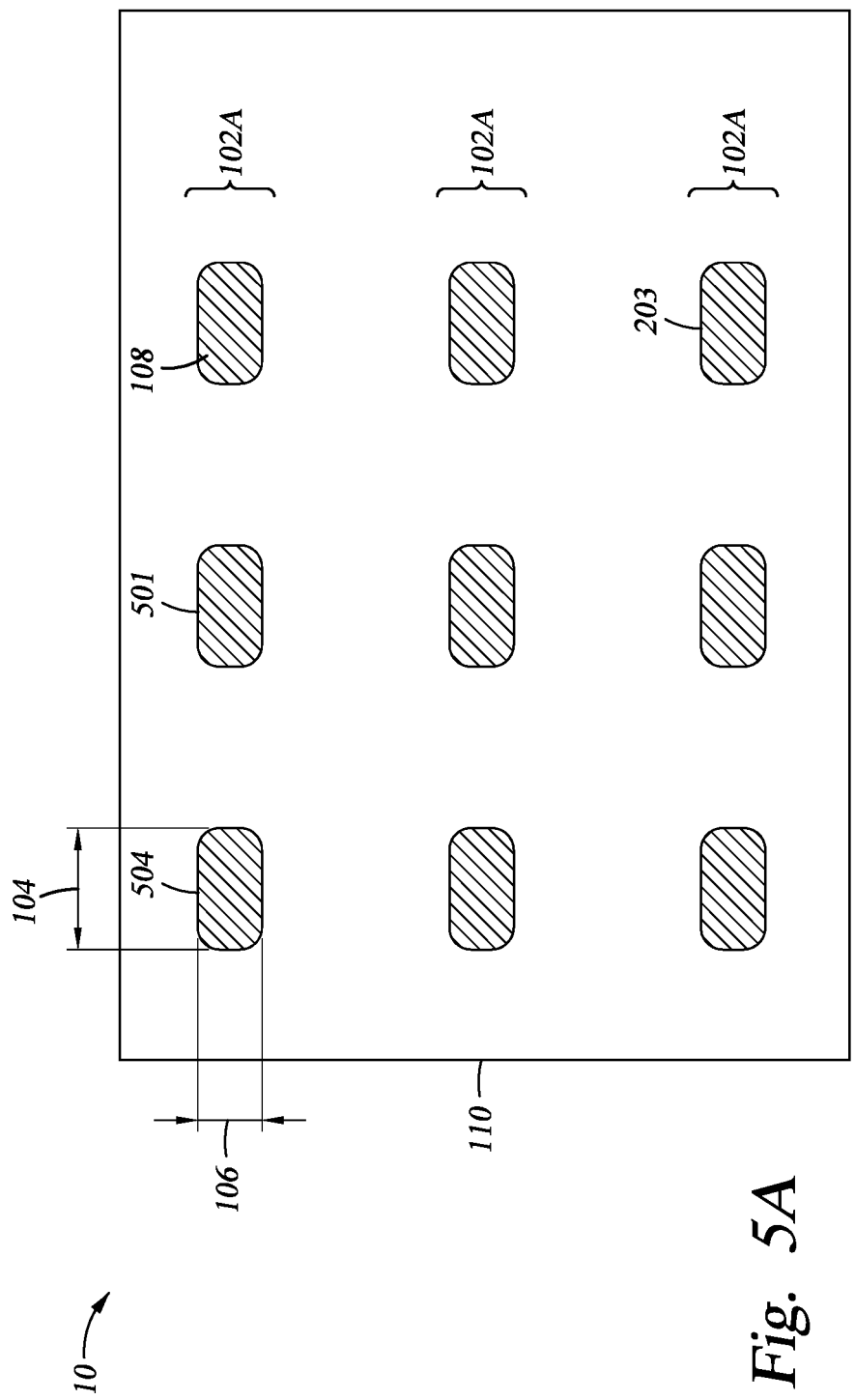
Figure 5B:
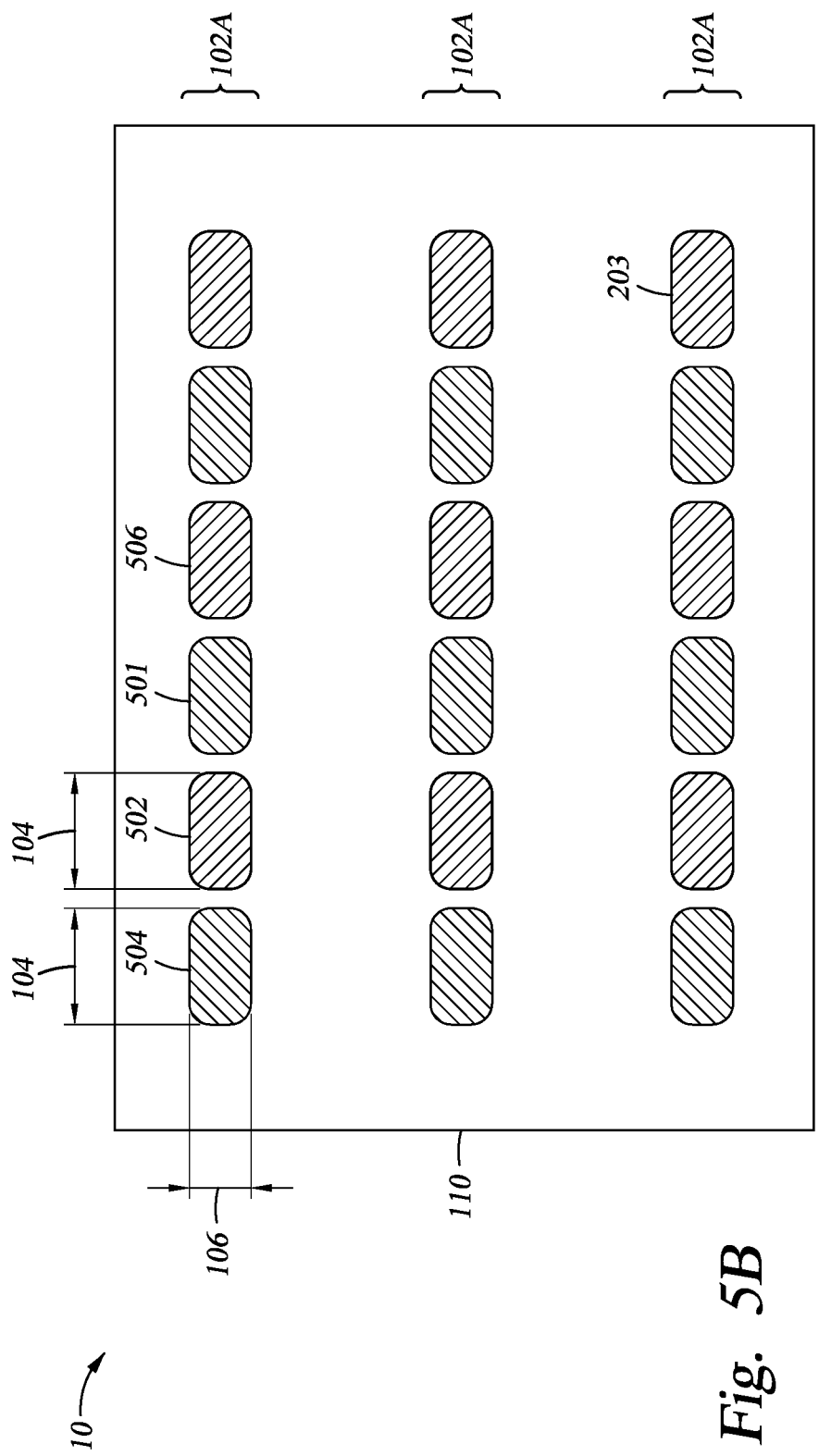
Figure 5C:
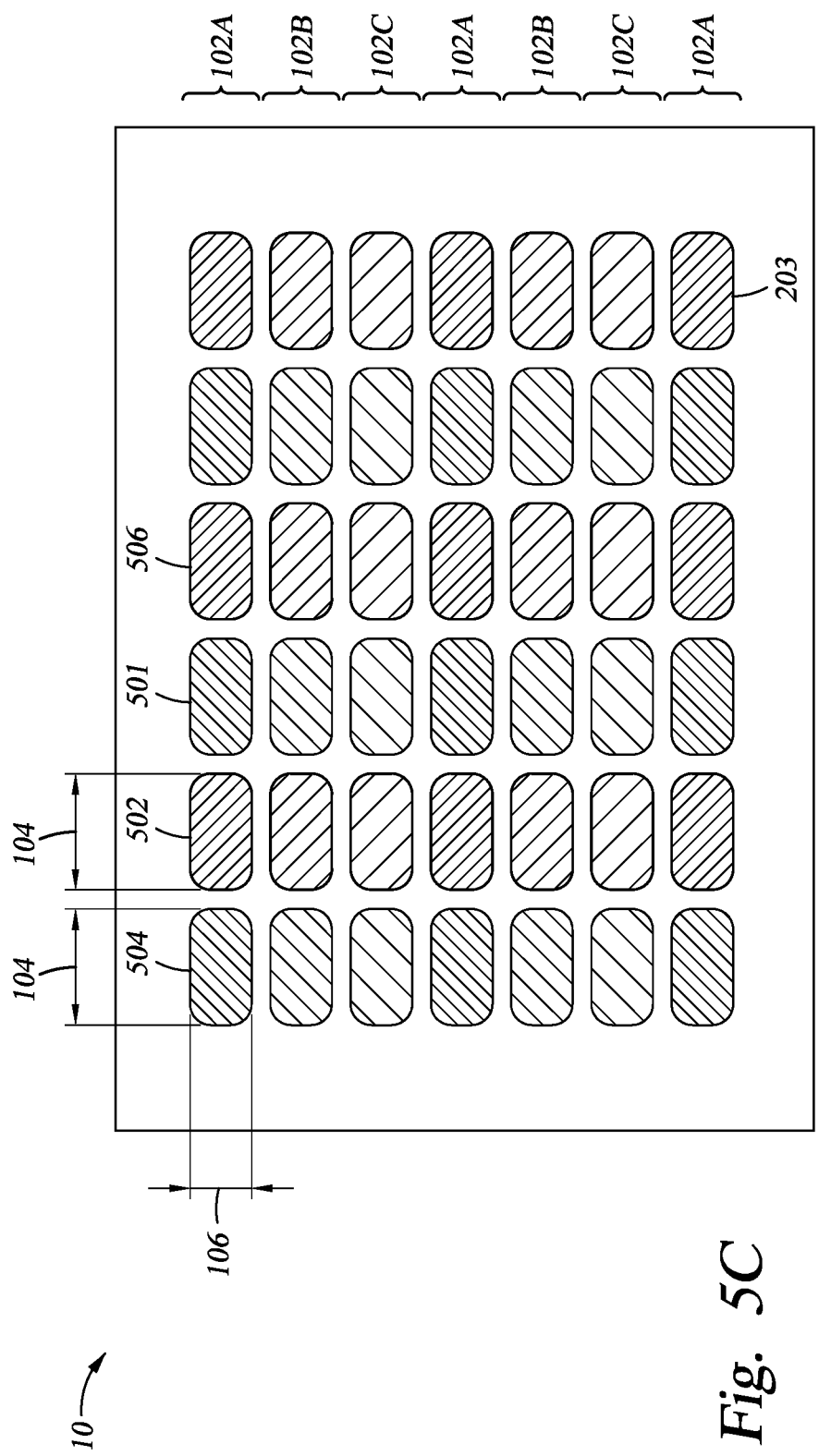
Figure 5D:
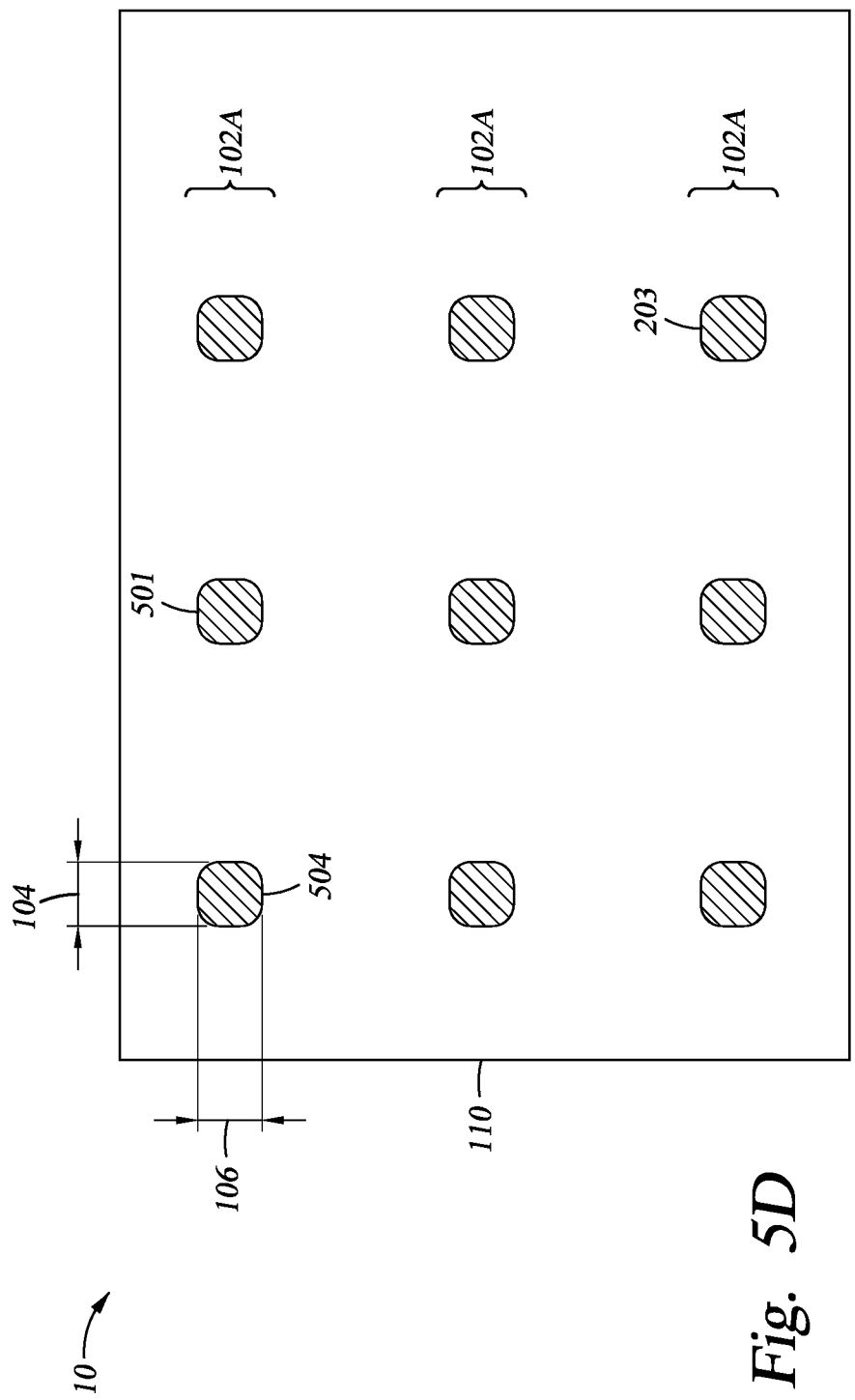

At operation 401, as shown in FIGS. 5A, 5D, and 5G, one or more first layers 504 of a material 203 are deposited. The one or more first layers 504 are deposited on first EL devices 501 of the groups 102A of the array 10. The first EL devices 501 correspond to the EL devices 100. The material 203 includes one or more of the organic layer 140 (including one or more of a HIL 141, a HTL 142, an EML 143, an ETL 144, or an EIL 145), or the capping layer 160. The one or more first layers 504 of the material 203 are deposited on the first EL devices 501 in a thermal evaporation chamber 302R of the processing system 300A. The thermal evaporation chamber 302R is one of the thermal evaporation chambers 200A or the thermal evaporation chamber 200B of FIGS. 2A and 2B.

One of the thermal evaporation chambers 200A, 200B heats the material 203 until it becomes gas. The material 203 sublimates and passes through an opening area 216 of a mask arrangement 201. As shown in FIG. 5A, the one or more first layers 504 of the material 203 are deposited on a device area 108 corresponding to the mask arrangement 201 of FIG. 2C. As shown in FIG. 5D, the one or more first layers 504 of the material 203 are deposited on a device area 108 corresponding to the mask arrangement 201 of FIG. 2D. As shown in FIG. 5G, the one or more first layers 504 of the material 203 are deposited on a device area 108 corresponding to the mask arrangement 201 of FIG. 2E. The first EL devices 501 have a width 104 and a length 106 and may be smaller than 20 µm. In one embodiment, which can be combined with other embodiments described herein, the material 203 corresponds to the organic layer 140. The material 203 corresponding to the organic layer 140 passes through the mask arrangement 201 and forms the one or more first layers 504 of the first EL devices 501. The organic layer 140 emits a first light (e.g., red light).

Prior to operation 401, one or more initial layers are deposited. The one or more initial layers may include the organic layer 140 (including one or more of a HIL 141 or a HTL 142). The one or more initial layers are deposited over the PDL 120 and the bottom electrode layer 130. The one or more initial layers are deposited by one or more chambers 301 of the processing system 300A. The one or more initial layers are deposited sequentially. The chambers 301 can be any chamber suitable to deposit the one or more initial layers such as chambers configured for thermal evaporation under vacuum, ink jet printing, vapor jet printing, or any other suitable technique, or combinations thereof.

Figure 5F:
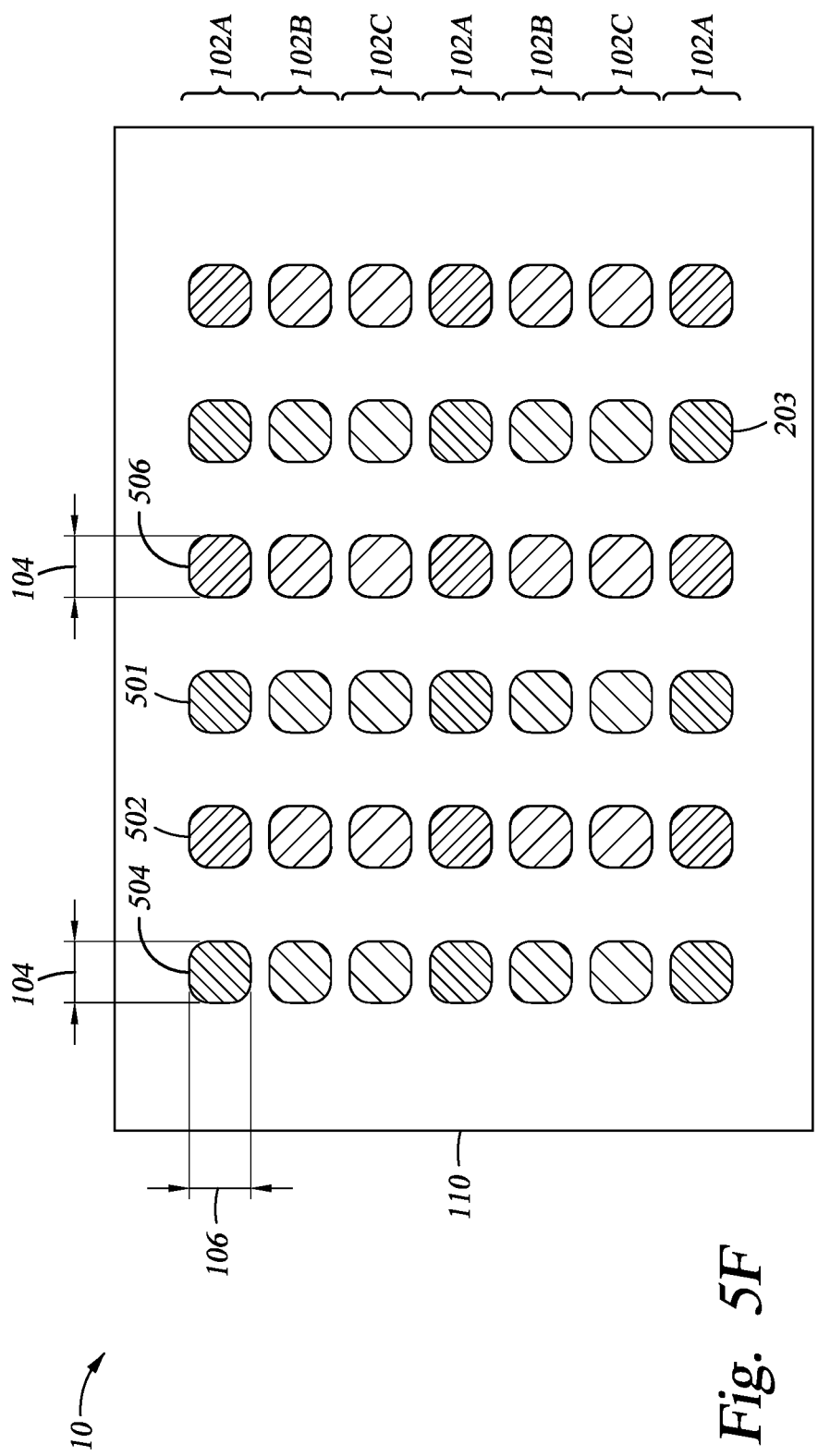
Figure 5H:
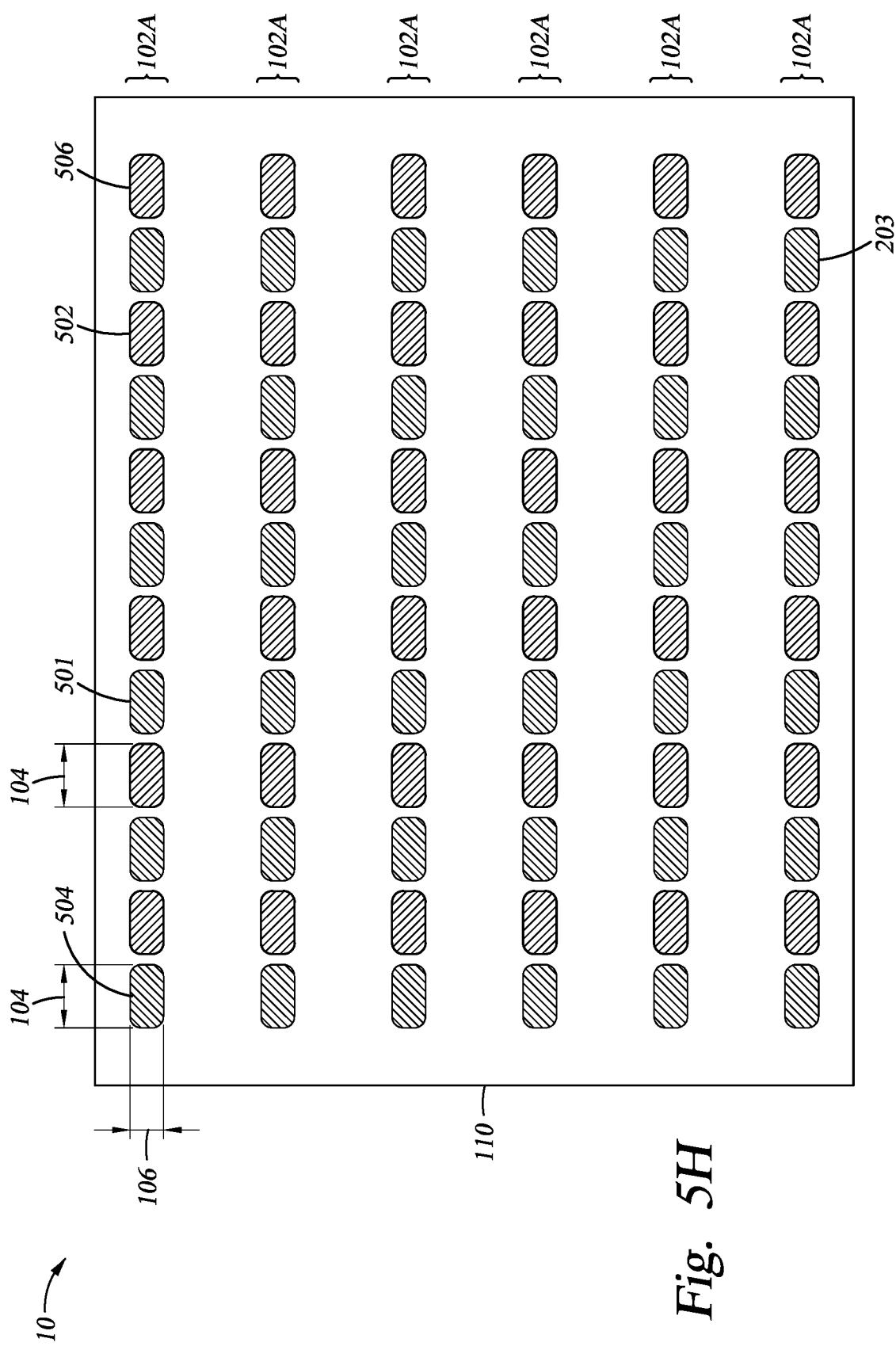

At operation 402, as shown in FIGS. 5B, 5E, and 5H, one or more second layers 506 of a material 203 are deposited. The one or more second layers 506 are deposited on second EL devices 502 of the groups 102A of the array 10. The second EL devices 502 correspond to the EL devices 100. The material 203 includes one or more of the organic layer 140 (including one or more of a HIL 141, a HTL 142, an EML 143, an ETL 144, or an EIL 145), or the capping layer 160. The one or more second layers 506 of the material 203 are deposited on the second EL devices 502 in a thermal evaporation chamber 304R of the processing system 300A. In one embodiment, which can be combined with other embodiments described herein, the thermal evaporation chamber 304R corresponds to one of the thermal evaporation chambers 200A, 200B.

One of the thermal evaporation chambers 200A, 200B heats the material 203 until it becomes gas. The material 203 sublimates and passes through an opening area 216 of the mask arrangement 201. In one embodiment, which can be combined with other embodiments described herein, the mask arrangement 201 is shifted such that the one or more second layers 506 are deposited adjacent the one or more first layers 504. In another embodiment, which can be combined with other embodiments described herein, the substrate 110 is shifted such that the one or more second layers 506 are deposited adjacent the one or more first layers 504. In yet another embodiment, which can be combined with other embodiments described herein, the opening area 216 of the mask arrangement 201 is positioned such that no shift is needed to deposit the one or more second layers 506 adjacent the one or more first layers 504. As shown in FIG. 5B, the one or more second layers 506 of the material 203 are deposited on a device area 108 corresponding to the mask arrangement 201 of FIG. 2C. As shown in FIG. 5E, the one or more second layers 506 of the material 203 are deposited on a device area 108 corresponding to the mask arrangement 201 of FIG. 2D. As shown in FIG. 5H, the one or more second layers 506 of the material 203 are deposited on a device area 108 corresponding to the mask arrangement 201 of FIG. 2E. The second EL devices 502 have a width 104 and a length 106 and may be smaller than 20 μm.

In one embodiment, which can be combined with other embodiments described herein, the material 203 corresponds to the organic layer 140. The material 203 corresponding to the organic layer 140 passes through the mask arrangement 201 and forms the one or more second layers 506 of the second EL devices 502. The organic layer 140 emits a first light (e.g., red light). Although the first EL devices 501 and second EL devices 502 in FIGS. 5A-5I are depicted to have a square or rectangular shape the first EL devices 501 and second EL devices 502 can have any shape such as a circular, triangular, or polygonal shape.

Figure 5I:
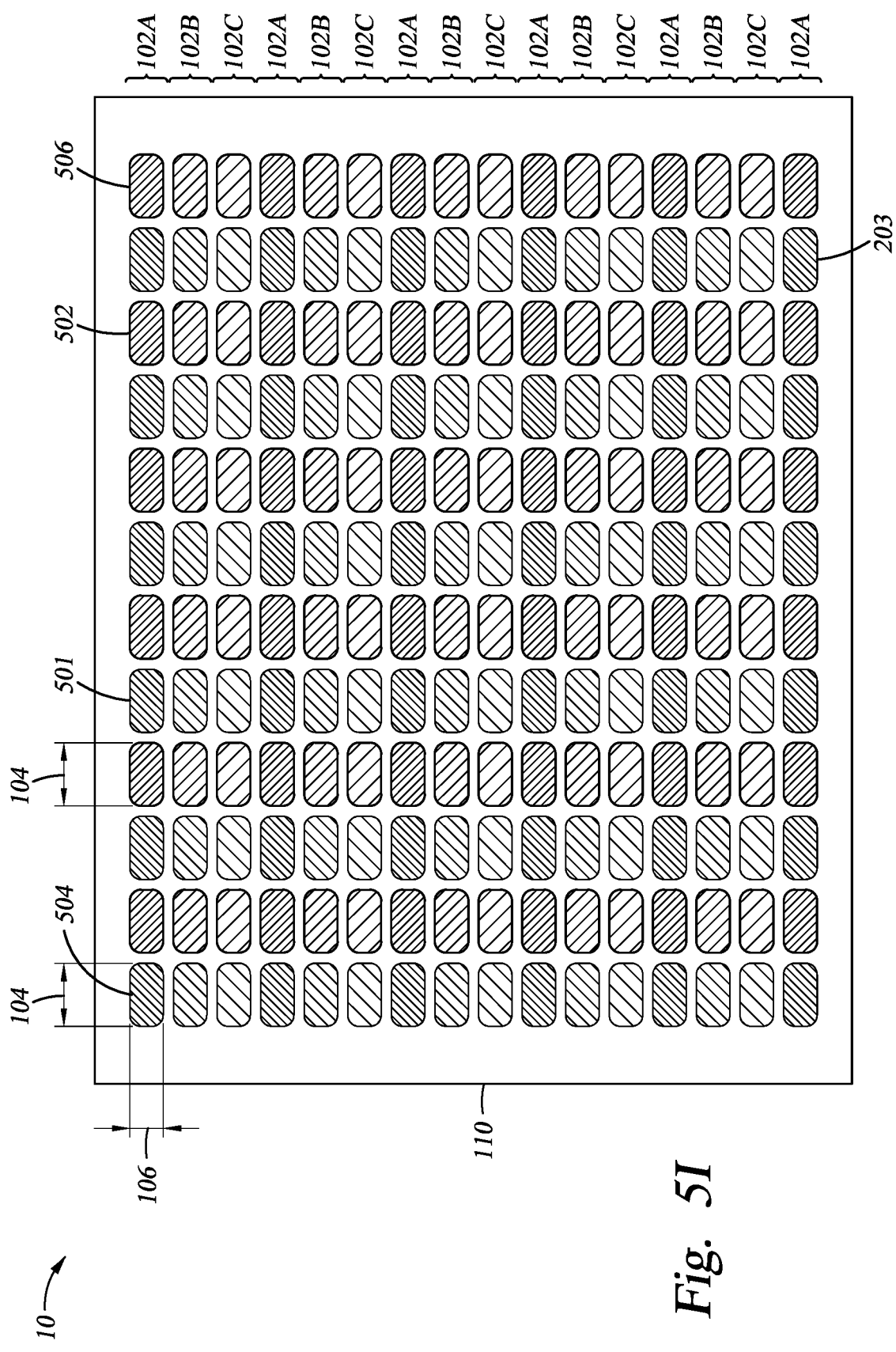

At operation 403, as shown in FIGS. 5C, 5F, and 5I, operations 401 and 402 are repeated. The operations 401 and 402 are repeated to deposit one or more first layers 504 of the material 203 and one or more second layers 506 of the material 203 in groups 102B and 102C. The one or more first layers 504 are deposited on the first EL devices 501 and the one or more second layers 506 are deposited on the second EL devices 502. The one or more first layers 504 of group 102B are deposited in a thermal evaporation chamber 302G of the processing system 300A. The one or more second layers 506 of groups 102B are deposited in a thermal evaporation chamber 304G of the processing system 300A. The one or more first layers 504 of group 102C are deposited in a thermal evaporation chamber 302B of the processing system 300A. The one or more second layers 506 of groups 102C are deposited in a thermal evaporation chamber 304B of the processing system 300A. In one embodiment, which can be combined with other embodiments described herein, the mask arrangement 201 is shifted such that the one or more groups 102B and 102C are deposited adjacent the one or more groups 102A. In another embodiment, which can be combined with other embodiments described herein, the substrate 110 is shifted such that the one or more groups 102b and 102C are deposited adjacent the one or more groups 102A. In yet another embodiment, which can be combined with other embodiments described herein, the opening area 216 of the mask arrangement 201 is positioned such that no shift is needed to deposit the one or more groups 102b and 102C adjacent the one or more groups 102A.

As shown in FIG. 5C, the one or more first layers 504 and the one or more second layers 506 of the material 203 are deposited on a device area 108 corresponding to the mask arrangement 201 of FIG. 2C. As shown in FIG. 5F, the one or more first layers 504 and the one or more second layers 506 of the material 203 are deposited on a device area 108 corresponding to the mask arrangement 201 of FIG. 2D. As shown in FIG. 5I, the one or more first layers 504 and the one or more second layers 506 of the material 203 are deposited on a device area 108 corresponding to the mask arrangement 201 of FIG. 2E. Smaller device areas 108 and higher density of the EL devices 100 can be realized by repeated depositions from chambers with the mask arrangements 201. After completion of operation 403, the array 10 has a PPI that is at least 400. In one embodiment, which can be combined with other embodiments described herein, the material 203 corresponds to the organic layer 140. The material 203 for the group 102B emits a second light (e.g., green light). The material 203 for the group 102C emits a third light (e.g., blue light).

After operation 403, one or more sequential layers are deposited. The one or more sequential layers may include the organic layer 140 (including one or more of an ETL 144 or an EIL 145), the top electrode layer 150, or the capping layer 160. The one or more sequential layers are deposited by one or more chambers 303 of the processing system 300A. The one or more sequential layers are deposited sequentially. The chambers 303 can be any chamber suitable to deposit the one or more sequential layers such as chambers configured for thermal evaporation under vacuum, ink jet printing, vapor jet printing, sputtering, or any other suitable technique, or combinations thereof.

Figure 6:
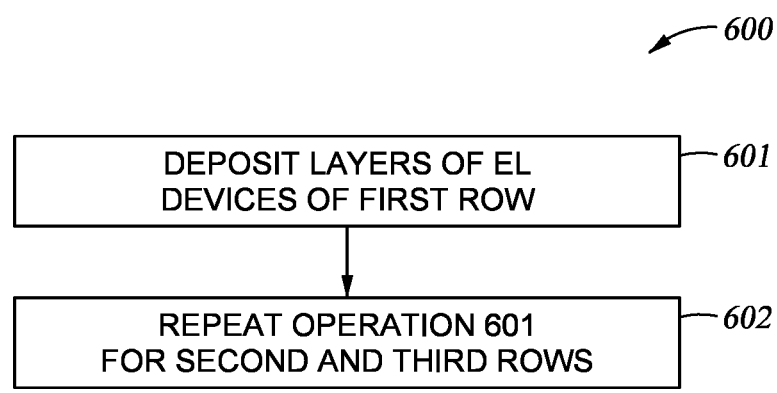
FIG. 6 is a flow diagram of a method for forming the array of EL devices, according to embodiments described herein.

FIG. 6 is a flow diagram of a method 600 for forming the array 10 of EL devices 100. FIGS. 7A and 7B are schematic, top views of an array 10 of electroluminescent (EL) devices 100, according to embodiments described herein. To facilitate explanation, the method 600 will be described with reference to the processing system 300B of FIG. 3B. However, it is to be noted that processing systems other than the processing system 300B may be utilized in conjunction with method 600.

At operation 601, as shown in FIG. 7A, one or more layers 704 of a material 203 are deposited. The one or more layers 704 are deposited on EL devices 100 of the groups 102A of the array 10. The material 203 includes one or more of the organic layer 140 (including one or more of a HIL 141, a HTL 142, an EML 143, an ETL 144, or an EIL 145), or the capping layer 160. The one or more layers 704 of the material 203 are deposited on the EL devices 100 in a thermal evaporation chamber 306R of the processing system 300B. The thermal evaporation chamber 306R is one of the thermal evaporation chambers 200A or the thermal evaporation chamber 200B of FIGS. 2A and 2B.

One of the thermal evaporation chambers 200A, 200B heats the material 203 until it becomes gas. The material 203 sublimates and passes through an opening area 216 of the mask arrangement 201. As shown in FIG. 7A, the one or more layers 704 of the material 203 are deposited on a device area 108 corresponding to the mask arrangement 201 of FIG. 2E. The EL devices 100 have a width 104 and a length 106 and may be smaller than 20 μm. In one embodiment, which can be combined with other embodiments described herein, the material 203 corresponds to the organic layer 140. The material 203 corresponding to the organic layer 140 passes through the mask arrangement 201 and forms the one or more layers 704 of the EL devices 100. The organic layer 140 emits a first light (e.g., red light).

The mask arrangement 201 of FIG. 2E deposits the one or more layers 704 on the EL devices 100 to form the array 10 such that the array 10 has a PPI that does not require a second layer deposition process. By appropriate design and arrangement of the first apertures 210 of the first mask plate 206 and the second apertures 212 of the second mask plate 208, one or more opening areas 216 can be formed to achieve high pixel density in a single thermal evaporation chamber. The PPI of the array 10 is at least 400. Therefore, the one or more layers 704 in the group 102A are deposited in a single thermal deposition chamber 306R.

Prior to operation 601, one or more initial layers are deposited. The one or more initial layers may include the organic layer 140 (including one or more of a HIL 141 or a HTL 142). The one or more initial layers are deposited over the PDL 120 and the bottom electrode layer 130. The one or more initial layers are deposited by one or more chambers 301 of the processing system 300B. The one or more initial layers are deposited sequentially. The chambers 301 can be any chamber suitable to deposit the one or more initial layers such as chambers configured for thermal evaporation under vacuum, ink jet printing, vapor jet printing, or any other suitable technique, or combinations thereof.

At operation 602, as shown in FIG. 7B, operation 601 is repeated. The operation 601 is repeated to deposit one or more layers 704 of the material 203 in groups 102B and 102C. The one or more layers 704 are deposited on the EL devices 100. The one or more layers 704 of group 102B are deposited in a thermal evaporation chamber 306G of the processing system 300B. The one or more layers 704 of group 102C are deposited in a thermal evaporation chamber 306B of the processing system 300B. As shown in FIG. 7B, the one or more layers 704 of the material 203 are deposited on a device area 108 corresponding to the mask arrangement 201 of FIG. 2E. In one embodiment, which can be combined with other embodiments described herein, the material 203 corresponds to the organic layer 140. The material 203 for the group 102B emits a second light (e.g., green light). The material 203 for the group 102C emits a third light (e.g., blue light). Although the EL devices 100 in FIGS. 7A and 7B are depicted to have a square or rectangular shape, the EL devices 100 can have any shape such as a circular, triangular, or polygonal shape.

After operation 602, one or more sequential layers are deposited. The one or more sequential layers may include the organic layer 140 (including one or more of an ETL 144 or an EIL 145), the top electrode layer 150, or the capping layer 160. The one or more sequential layers are deposited by one or more chambers 303 of the processing system 300B. The one or more sequential layers are deposited sequentially. The chambers 303 can be any chamber suitable to deposit the one or more sequential layers such as chambers configured for thermal evaporation under vacuum, ink jet printing, vapor jet printing, sputtering, or any other suitable technique, or combinations thereof.

In summation, embodiments described herein relate to methods for forming arrays of EL devices and forming the EL devices with overlapped mask plates. The methods utilize overlapping a first mask plate and a second mask plate to form a mask arrangement having first apertures of the first mask plate overlapped with second apertures of the second mask plate forming one or more opening areas. A material is evaporated through the mask arrangement such that layers of the material are formed in a device area of the EL devices. The device area of each of the EL devices corresponds to the opening area of the mask arrangement of the first mask plate and the second mask plate. The method described herein allows for a higher density of the EL devices and creates a smaller deposition area due to the opening area of the mask arrangement.

While the foregoing is directed to embodiments of the present disclosure, other and further embodiments of the disclosure may be devised without departing from the basic scope thereof, and the scope thereof is determined by the claims that follow.

What is claimed is:

1. A method, comprising:
    positioning a first mask plate and a second mask plate adjacent to a substrate having an array including one or more first groups of first electroluminescent (EL) devices, the array including a pixel-per-inch (PPI) of at least about 400, and the first mask plate and the second mask plate are overlapped to form a mask arrangement having first apertures of the first mask plate overlapped with second apertures of the second mask plate forming one or more opening areas; and
    evaporating a material through the one or more opening areas to deposit one or more first layers of the material onto a device area of each of the first EL devices, the device area of each of the first EL devices corresponding to the opening area of the mask arrangement of the first mask plate and the second mask plate.

2. The method of claim 1, wherein the one or more first groups further include second EL devices, the second EL devices adjacent to the first EL devices.

3. The method of claim 2, further comprising evaporating the material through the one or more opening areas to deposit one or more second layers of the material onto the device area of each of the second EL devices, the device area of each of the second EL devices corresponding to the one or more opening areas of the mask arrangement of the first mask plate and the second mask plate.

4. The method of claim 3, wherein the array further includes one or more second groups and one or more third groups of the first EL devices and the second EL devices.

5. The method of claim 4, further comprising depositing the one or more first layers of the material onto the device area of the first EL devices of the one or more second groups and depositing the one or more second layers of the material onto the device area of the second EL devices of the one or more second groups.

6. The method of claim 5, further comprising depositing the one or more first layers of the material onto the device area of the first EL devices of the one or more third groups and depositing the one or more second layers of the material onto the device area of the second EL devices of the one or more third groups.

7. The method of claim 6, wherein the material is a capping layer or an organic layer, the organic layer including a plurality of organic sublayers including one or more of a hole injection layer (HIL), a hole transport layer (HTL), an emissive layer (EML), an electron transport layer (ETL), or an electron injection layer (EIL).

8. The method of claim 7, wherein the material deposited in the one or more first groups emits a first light, the material deposited in the one or more second groups emits a second light, and wherein the material deposited in the one or more third groups emits a third light.

9. The method of claim 2, wherein the evaporating the material through the one or more opening areas to deposit the one or more second layers of the material onto the device area of each of the second EL devices is in a second thermal evaporation chamber.

10. The method of claim 1, wherein the evaporating the material through the one or more opening areas to deposit the one or more first layers of the material onto the device area of each of the first EL devices is in a first thermal evaporation chamber.

11. The method of claim 1, wherein the first mask plate and the second mask plate are coupled to one or more frames.

12. The method of claim 1, wherein the array further includes two or more groups of the first EL devices and second EL devices adjacent to the first EL devices.

13. A method, comprising:
    positioning a first mask plate and a second mask plate adjacent to a substrate having an array including one or more first groups of first electroluminescent (EL) devices, the array including a pixel-per-inch (PPI) of at least about 400, and the first mask plate and the second mask plate are overlapped to form a mask arrangement having first apertures of the first mask plate overlapped with second apertures of the second mask plate forming one or more opening areas; and evaporating a material of an organic layer through the one or more opening areas to deposit one or more first layers of the material of the organic layer onto a device area of each of the first EL devices, the device area of each of the first EL devices corresponding to the one or more opening areas of the mask arrangement of the first mask plate and the second mask plate.

14. The method of claim 13, wherein the one or more first groups further include second EL devices, the second EL devices adjacent to the first EL devices.

15. The method of claim 14, wherein the array further includes two or more groups of the first EL devices and the second EL devices.

16. The method of claim 13, wherein the material is a capping layer or an organic layer, the organic layer including a plurality of organic sublayers including one or more of a hole injection layer (HIL), a hole transport layer (HTL), an emissive layer (EML), an electron transport layer (ETL), or an electron injection layer (EIL).

17. A method, comprising:

positioning a first mask plate and a second mask plate adjacent to a substrate having an array including one or more first groups of first electroluminescent (EL) devices, the first mask plate and the second mask plate are overlapped to form a mask arrangement having first apertures of the first mask plate overlapped with second apertures of the second mask plate forming one or more opening areas, the one or more opening areas include a width less than about 20 µm and a length less than about 20 µm; and evaporating a material through the one or more opening areas to deposit one or more first layers of the material onto a device area of each of the first EL devices, the device area of each of the first EL devices corresponding to the opening area of the mask arrangement of the first mask plate and the second mask plate.

18. A method, comprising:

positioning a first mask plate and a second mask plate adjacent to a substrate having an array including one or more first groups of first electroluminescent (EL) devices, the first mask plate and the second mask plate are overlapped to form a mask arrangement having first apertures of the first mask plate overlapped with second apertures of the second mask plate forming one or more opening areas, the one or more opening areas include a width less than about 20 µm and a length less than about 20 µm; and evaporating a material of an organic layer through the one or more opening areas to deposit one or more first layers of the material of the organic layer onto a device area of each of the first EL devices, the device area of each of the first EL devices corresponding to the one or more opening areas of the mask arrangement of the first mask plate and the second mask plate.

* * * * *